(12) United States Patent
Ohba et al.

(10) Patent No.: US 8,471,348 B2
(45) Date of Patent: Jun. 25, 2013

(54) SOLID-STATE IMAGING ELEMENT, METHOD OF MANUFACTURING THE SAME, SOLID-STATE IMAGING APPARATUS, AND IMAGING APPARATUS

(75) Inventors: Yoshiyuki Ohba, Kumamoto (JP); Susumu Hiyama, Kumamoto (JP); Itaru Oshiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 110 days.

(21) Appl. No.: 13/216,712

(22) Filed: Aug. 24, 2011

(65) Prior Publication Data
US 2012/0049306 A1   Mar. 1, 2012

(30) Foreign Application Priority Data
Aug. 31, 2010 (JP) .................. 2010-194181

(51) Int. Cl.
*H01L 31/0232* (2006.01)
*H01L 21/00* (2006.01)

(52) U.S. Cl.
USPC .............. 257/432; 257/435; 257/E31.122; 257/E31.127; 438/69

(58) Field of Classification Search
USPC .............. 438/69; 257/432, 435, E31.122, 257/E31.127
See application file for complete search history.

(56) References Cited

U.S. PATENT DOCUMENTS

| 7,556,912 B2* | 7/2009 | Mori et al. ............... 430/270.13 |
| 2009/0189235 A1* | 7/2009 | Ikeda et al. ................... 257/432 |
| 2012/0015473 A1* | 1/2012 | Uchida et al. ................. 438/87 |

FOREIGN PATENT DOCUMENTS

| JP | 2003-229556 | 8/2003 |
| JP | 2010-016128 | 1/2010 |

* cited by examiner

*Primary Examiner* — David S Blum
(74) *Attorney, Agent, or Firm* — Dentons US LLP

(57) ABSTRACT

A solid-state imaging element includes a semiconductor substrate that has a light reception portion performing a photoelectric conversion of an incident light; an oxide layer that is formed on a surface of the semiconductor substrate; a light shielding layer that is formed on an upper layer further than the oxide layer via an adhesion layer; and an oxygen supply layer that is disposed between the oxide layer and the adhesion layer and is formed of a material which shows an oxidation enthalpy smaller than that of a material forming the oxide layer.

19 Claims, 23 Drawing Sheets

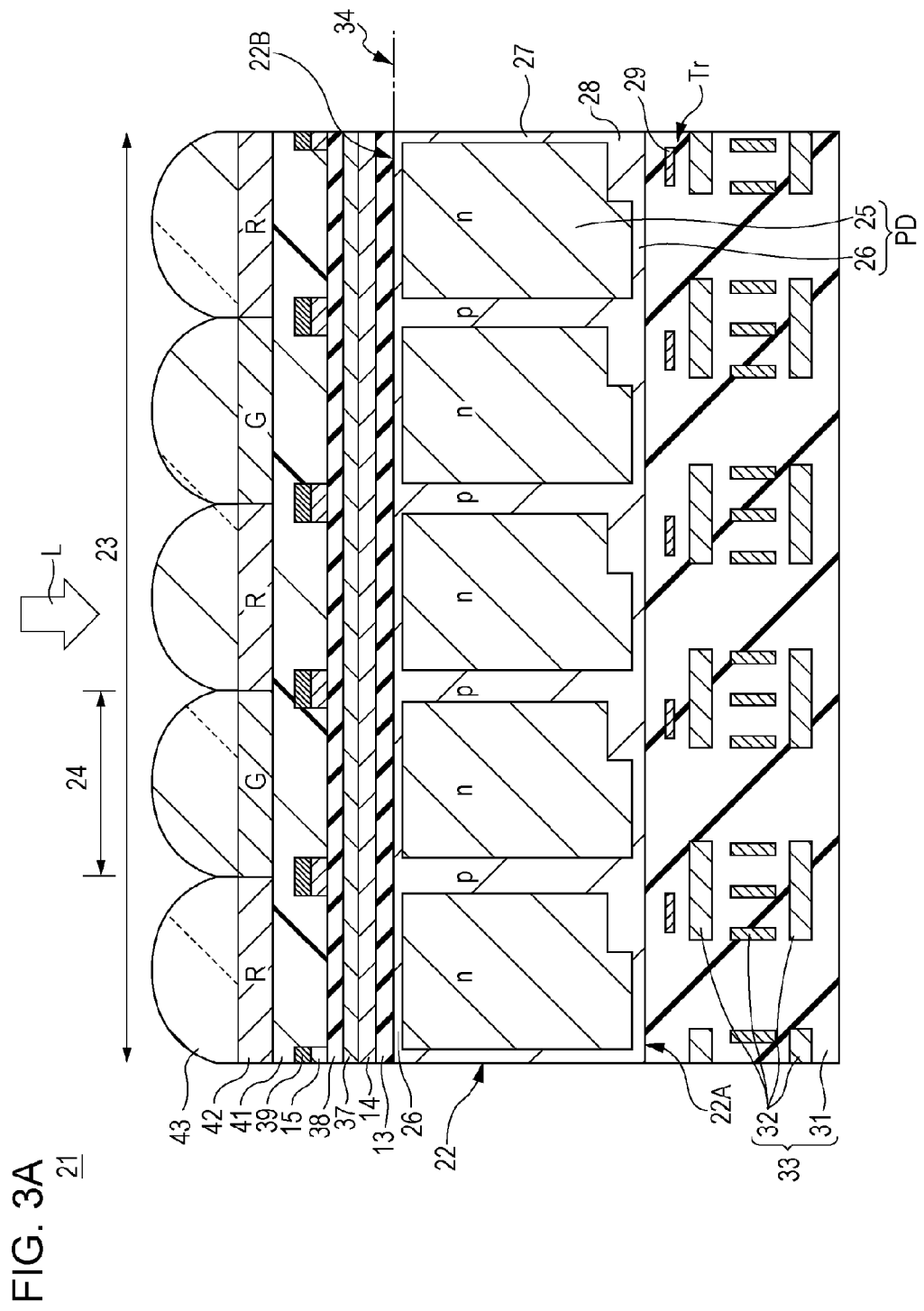

SOLID-STATE IMAGING ELEMENT, METHOD OF MANUFACTURING THE SAME, SOLID-STATE IMAGING APPARATUS, AND IMAGING APPARATUS

BACKGROUND

The present disclosure relates to solid-state imaging element, a method of manufacturing the same, a solid-state imaging apparatus, and an imaging apparatus. Specifically, the present disclosure relates to a solid-state imaging element capable of suppressing the generation of a dark current, a method of manufacturing the same, and a solid-state imaging apparatus and an imaging apparatus using such a solid-state imaging element.

In related art, in a video camera, a digital camera or the like, a solid-state imaging apparatus including a CCD (Charge Coupled Device) or a CMOS image sensor is widely used. In addition, in a CMOS type solid-state imaging apparatus, a surface irradiation type shown in FIG. 20 and a back irradiation type shown in FIG. 21 are used.

As shown in a schematic configuration diagram of FIG. 20, a surface irradiation type solid-state imaging apparatus 111 is configured to have a pixel region 113 in which a plurality of photodiodes PD becoming photoelectric conversion portions and a plurality of unit pixels 116 including a plurality of pixel transistors are formed on a semiconductor substrate 112. Although it is not shown, the pixel transistor shows a gate electrode 114 in FIG. 20 and schematically shows the existence of the pixel transistor.

Each photodiode PD is divided by an element separation region 115 formed of an impurity diffusion layer, and a multilayer wiring layer 119, on which a plurality of wirings 118 is disposed via an inter-layer insulation film 117, is formed on a surface side of the semiconductor substrate 112 formed with the pixel transistor. The wirings 118 are formed except for a portion corresponding to the position of the photodiode PD.

On the multilayer wiring layer 119, an on-chip color filter 121 and an on-chip micro lens 122 are sequentially formed via a planarization film 120. The on-chip color filter 121 is configured, for example, by arranging each color filter of red (R), green (G), and blue (B).

In the surface irradiation type solid-state imaging apparatus 111, light L is incident from the substrate surface side by using the substrate surface formed with the multilayer wiring layer 119 as a light reception surface 123.

Meanwhile, as shown in a schematic configuration diagram of FIG. 21, the back irradiation type solid-state imaging apparatus 131 is configured to have the pixel region 113 on which a plurality of photodiodes PD becoming the photoelectric conversion portions and the plurality of unit pixels 116 including the plurality of pixel transistors are formed on the semiconductor substrate 112. Although it is not shown, the pixel transistor is formed on the substrate surface side, shows the gate electrode 114 in FIG. 21, and schematically shows the existence of the pixel transistor.

Each photodiode PD is divided by the element separation region 115 formed of the impurity diffusion layer, and the multilayer wiring layer 119, on which a plurality of wirings 118 is disposed via an inter-layer insulation film 117, is formed on a surface side formed with the pixel transistor of the semiconductor substrate 112. In the back irradiation type, the wirings 118 can be formed regardless of the position of the photodiode PD.

Furthermore, on the back of the semiconductor substrate 112 which the photodiode PD faces, an insulation layer 128, an on-chip color filter 121, and an on-chip micro lens 122 are sequentially formed.

In the back irradiation type solid-state imaging apparatus 131, a substrate back of an opposite side of the substrate surface formed with the multilayer wiring layer and the pixel transistor is used as a light reception surface 132, and the light L is incident from the substrate back side. In addition, the light L is incident into the photodiode PD without being constrained by the multilayer wiring layer 119, and thus an opening of the photodiode PD can be expanded and high sensitivity is realized.

Incidentally, in the solid-state imaging apparatus as mentioned above, it is extremely important to promote an improvement in sensitivity and a reduction in noise. In particular, in the state in which an incident light does not exist, the dark current becoming a generation source of an interface state in an interface between the semiconductor substrate provided with a light reception portion performing the photoelectric conversion and an upper layer film is a noise to be reduced as the solid-state imaging apparatus.

Herein, the dark current is a phenomenon in which electrons are created from the photodiode PD and the periphery thereof even in the state where light is not incident to the light reception portion. When a large amount of the dark current is generated, a dark level becoming a standard of imaging capability of the solid-state imaging element deteriorates, whereby it is difficult to obtain resolution of a sufficient gray scale, and the sensitivity during imaging declines.

Furthermore, the interface state is an energy state in which electrons can exist due to a crystal defect in the semiconductor substrate or impurity, a bonding defect with an oxide film interface. When the interface state is increased, the generation of dark current is encouraged.

In addition, a factor of the interface state includes damage to the interface layer that is generated because oxygen atoms (O) are removed from the interface between the surface of the semiconductor substrate provided with the light reception portion performing the photoelectric conversion and the oxide film covering the same.

Hereinafter, this will be described using the drawings.

FIG. 22 is a schematic diagram that shows a structure of a back irradiation type solid-state imaging apparatus. The apparatus has a semiconductor substrate (Si substrate) 201 provided with a light reception portion (not shown) and an oxide film (SiO) 202 formed on the semiconductor substrate surface. Furthermore, a reflection preventing film (SiON) 203 is provided on the upper layer of the oxide film 202, an insulation film ($SiO_2$) 204 is provided on the upper layer thereof, and a light shielding film (W) 206 is provided on a further upper layer of the insulation film 204 via an adhesion layer (Ti) 205.

Herein, the adhesion layer (Ti) 205 is formed so as to promote an improvement in adhesion between the light shielding film (W) 206 and the insulation film ($SiO_2$) 204, but Ti has strong bonding strength with oxygen (O). Moreover, the oxygen atom (O) is removed from the interface between the oxide film 202 and the semiconductor substrate 201 by a reduction action due to Ti, whereby, as mentioned above, damage is generated in the interface between the oxide film 202 and the semiconductor substrate 201, and consequently, the generation of dark current is encouraged.

Incidentally, one technique for reducing the dark current is a method of hydrogen-terminating an uncombined hand of Si due to defect by heat-treating the bonding defect becoming the cause of the interface state in a hydrogen atmosphere (sintering).

However, in a region covered with the light shielding film, it may be hard to obtain an effect of hydrogen sinter processing, and it is difficult to sufficiently reduce the occurrence of interface state only by the technique.

For that reason, for example, Japanese Unexamined Patent Application Publication No. 2010-16128 suggests a technique of disposing a hydrogen supply film for supplying hydrogen to upper portions of the photoelectric conversion elements of each pixel and forming a diffusion preventing film for suppressing the diffusion of hydrogen between the hydrogen supply film and the light shielding member.

Furthermore, for example, Japanese Unexamined Patent Application Publication No. 2003-229556 suggests a technique in which the reflection preventing film is formed of material that does not contain titanium, and a barrier layer for a wiring and for a contact plug and the adhesion layer are formed of a material that does not contain titanium.

In addition, in the technique described in Japanese Unexamined Patent Application Publication No. 2010-16128, hydrogen is sufficiently supplied to the surface of the photoelectric conversion element, the gate insulation film or the like and the interface state can be terminated, and thus the dark current can be reduced.

Furthermore, it is possible to eliminate an increase in dark current noise due to an influence of titanium by the technique described in Japanese Unexamined Patent Application Publication No. 2003-229556.

SUMMARY

However, when the hydrogen supply film is formed, it is difficult to avoid the interface damage due to the oxygen defect in the interface between the semiconductor substrate and the oxide film.

Furthermore, when the wiring layer or the light shielding layer is formed without using titanium in the adhesion layer or the barrier metal, there is a concern that the reliability or adhesion of the wiring will deteriorate.

It is desirable to provide a solid-state imaging element, a method of manufacturing the same, a solid imaging apparatus and an imaging apparatus that can avoid the interface damage and can suppress the dark current without degrading the reliability or adhesion.

The solid-state imaging element according to an embodiment of the present disclosure includes a semiconductor substrate that has a light reception portion performing a photoelectric conversion of an incident light; an oxide layer that is formed on a surface of the semiconductor substrate; a light shielding layer that is formed on an upper layer further than the oxide layer via an adhesion layer; and an oxygen supply layer that is disposed between the oxide layer and the adhesion layer and is formed of a material which shows an oxidation enthalpy smaller than that of a material forming the oxide layer.

Herein, by the oxygen supply layer that is disposed between the oxide layer and the adhesion layer and is formed of a material which shows an oxidation enthalpy smaller than that of a material forming the oxide layer, the interface layer (an interface oxide) between the oxide layer and the semiconductor substrate is protected and is not damaged, whereby it is possible to suppress the generation of dark current due to the formation of the interface state.

That is, even if a material such a titanium or aluminum having a strong bonding strength with oxygen exists, since in such a material, removing oxygen of the oxygen supply layer is more stable than removing oxygen atoms of the oxide layer of the semiconductor substrate interface in view of the chemical reaction and energy, the interface layer (the interface oxide layer) between the oxide layer and the semiconductor substrate is protected as mentioned above, whereby the generation of dark current can be suppressed.

Furthermore, when the oxygen supply layer is formed over approximately the entire surface of the region corresponding to the region formed with the light reception portion of the semiconductor substrate, the interface layer (the interface oxide layer) between the oxide layer and the semiconductor substrate can be further satisfactorily protected, whereby a high effect can be expected in regard to the suppression of the generation of the dark current. In addition, when the oxygen supply layer is formed in the upper layer of the efficient pixel region, it is necessary to cause the incident light to reach the light reception portion, and thus, formation of the oxygen supply layer from a material having excellent light transmittance is necessary.

Furthermore, when the oxygen supply layer is formed only in the region corresponding to the region formed with the light shielding layer, the upper layer structure of the efficient pixel region has the same structure as that of the common solid-state imaging element (the solid-state imaging element in which the oxygen supply layer is not formed). For that reason, the transmittance or the refractive index of the material forming the oxygen supply layer may be anything. Since the degree of freedom of the material selection or the film formation condition is high and restrictions on the integration are few, it is possible to build the stable manufacturing process with wider process window conditions.

In addition, an example of the oxygen supply layer includes a case of configuring the oxygen supply layer using tantalum oxide ($Ta_2O_5$), niobium oxide ($Nb_2O_5$), vanadium oxide ($V_2O_3$), chromium oxide ($Cr_2O_3$), tungsten oxide ($WO_2$) or molybdenum oxide ($MoO_2$).

Furthermore, the solid-state imaging element according to an embodiment of the present disclosure includes a semiconductor substrate that has a light reception portion performing a photoelectric conversion of an incident light; an oxide layer that is formed on a surface of the semiconductor substrate; a wiring layer that is formed on an upper layer further than the oxide layer via an adhesion layer; and an oxygen supply layer that is disposed between the oxide layer and the adhesion layer and is formed of a material which shows an oxidation enthalpy smaller than that of a material forming the oxide layer.

Herein, by the oxygen supply layer that is disposed between the oxide layer and the adhesion layer and is formed of a material which shows an oxidation enthalpy smaller than that of a material forming the oxide layer, the interface layer (an interface oxide) between the oxide layer and the semiconductor substrate is protected and is not damaged, whereby it is possible to suppress the generation of dark current due to the formation of the interface state.

That is, even if a material such a titanium or aluminum having a strong bonding strength with oxygen exists, since in such a material, removing oxygen from the oxygen supply layer is more stable than removing oxygen atoms from the oxide layer of the semiconductor substrate interface in view of a chemical reaction and energy, the interface layer (the interface oxide layer) between the oxide layer and the semiconductor substrate is protected as mentioned above, whereby the generation of dark current can be suppressed.

Furthermore, when the oxygen supply layer is formed on approximately the entire surface of the region corresponding to the region formed with the light reception portion of the semiconductor substrate, the oxide layer (the interface oxide) can be more satisfactorily protected, whereby a high effect can be expected in regard to the suppression of the generation of the dark current. In addition, when the oxygen supply layer is formed in the upper layer of the efficient pixel region, it is necessary to cause the incident light to reach the light reception portion, and thus, formation of the oxygen supply layer from a material having excellent light transmittance is necessary.

Furthermore, when the oxygen supply layer is formed only in the region corresponding to the region formed with the wiring layer, the upper layer structure of the efficient pixel region has the same structure as that of the common solid-state imaging element (the solid-state imaging element in which the oxygen supply layer is not formed). For that reason, the transmittance or the refractive index of the material forming the oxygen supply layer may be anything. Since the degree of freedom of the material selection or the film formation condition is high and the restrictions on the integration are few, it is possible to build the stable manufacturing process with wider process window conditions.

Furthermore, a method of manufacturing the solid-state imaging element according to another embodiment of the present disclosure includes forming an oxygen supply layer formed of a material, which shows an oxidation enthalpy smaller than that of a material forming the oxide layer, on an upper layer of a semiconductor substrate that has a light reception portion performing a photoelectric conversion of an incident light and is formed with an oxide layer on the surface thereof; and forming a light shielding layer on an upper layer further than the oxygen supply layer via an adhesion layer.

Herein, by forming an oxygen supply layer formed of a material, which shows an oxidation enthalpy smaller than that of a material forming the oxide layer, on an upper layer of a semiconductor substrate that has a light reception portion performing a photoelectric conversion of an incident light and is formed with an oxide layer on the surface thereof, and then forming the light shielding layer on the upper layer of the oxygen supply layer via the adhesion layer, consequently, between the oxide layer and the adhesion layer, the oxygen supply layer is formed which is formed of the material which shows an oxidation enthalpy smaller than that of a material forming the oxide layer. For that reason, the interface layer (an interface oxide) between the oxide layer and the semiconductor substrate is protected and is not damaged, whereby it is possible to suppress the generation of dark current due to the formation of the interface state.

Furthermore, a method of manufacturing a solid-state imaging element according to still another embodiment of the present disclosure includes forming an oxygen supply layer formed of a material, which shows an oxidation enthalpy smaller than that of a material forming the oxide layer, on an upper layer of a semiconductor substrate that has a light reception portion performing a photoelectric conversion of an incident light and is formed with an oxide layer on the surface thereof; and forming a wiring layer on an upper layer further than the oxygen supply layer via an adhesion layer.

Herein, by forming an oxygen supply layer formed of a material, which shows an oxidation enthalpy smaller than that of a material forming the oxide layer, on an upper layer of a semiconductor substrate that has a light reception portion performing the photoelectric conversion of the incident light and is formed with the oxide layer on the surface thereof, and then forming the wiring layer on the upper layer of the oxygen supply layer via the adhesion layer, consequently, between the oxide layer and the adhesion layer, the oxygen supply layer is formed which is formed of the material which shows an oxidation enthalpy smaller than that of a material forming the oxide layer. For that reason, the interface layer (an interface oxide) between the oxide layer and the semiconductor substrate is protected and is not damaged, whereby it is possible to suppress the generation of dark current due to the formation of the interface state.

Furthermore, a solid-state imaging apparatus according to still another embodiment of the present disclosure includes a solid-state imaging element which has a semiconductor substrate that includes a light reception portion performing a photoelectric conversion of an incident light, an oxide layer that is formed on a surface of the semiconductor substrate, a light shielding layer that is formed on an upper layer further than the oxide layer via an adhesion layer, and an oxygen supply layer that is disposed between the oxide layer and the adhesion layer and is formed of a material which shows an oxidation enthalpy smaller than that of a material forming the oxide layer; and an optical system that focuses an incident light on the light reception portion.

Furthermore, a solid-state imaging apparatus according to still another embodiment of the present disclosure includes a solid-state imaging element which has a semiconductor substrate that includes a light reception portion performing a photoelectric conversion of an incident light, an oxide layer that is formed on a surface of the semiconductor substrate, a wiring layer that is formed on an upper layer further than the oxide layer via an adhesion layer, and an oxygen supply layer that is disposed between the oxide layer and the adhesion layer and is formed of a material which shows an oxidation enthalpy smaller than that of a material forming the oxide layer; and an optical system that focuses an incident light on the light reception portion.

Furthermore, an imaging apparatus according to still another embodiment of the present disclosure includes a solid-state imaging element which has a semiconductor substrate that includes a light reception portion performing a photoelectric conversion of an incident light, an oxide layer that is formed on a surface of the semiconductor substrate, a light shielding layer that is formed on an upper layer further than the oxide layer via an adhesion layer, and an oxygen supply layer that is disposed between the oxide layer and the adhesion layer and is formed of a material which shows an oxidation enthalpy smaller than that of a material forming the oxide layer; an optical system that focuses an incident light on the light reception portion; and a signal processing portion that processes a signal electric charge subjected to the photoelectric conversion in the light reception portion.

Furthermore, an imaging apparatus according to still another embodiment of the present disclosure includes a solid-state imaging element which has a semiconductor substrate that includes a light reception portion performing a photoelectric conversion of an incident light, an oxide layer that is formed on a surface of the semiconductor substrate, a wiring layer that is formed on an upper layer further than the oxide layer via an adhesion layer, and an oxygen supply layer that is disposed between the oxide layer and the adhesion layer and is formed of a material which shows an oxidation enthalpy smaller than that of a material forming the oxide layer; an optical system that focuses an incident light on the light reception portion; and a signal processing portion that processes a signal electric charge subjected to the photoelectric conversion in the light reception portion.

In the solid-state imaging element according to an embodiment of the present disclosure, the solid-state imaging element obtained by the manufacturing method thereof, the solid-state imaging apparatus, and the imaging apparatus, it is possible to avoid the interface damage and suppress the generation of the dark current without degrading the reliability or adhesion.

BRIEF DESCRIPTION OF THE DRAWINGS

FIG. 3A is a schematic diagram (1) for describing a modified example of the first embodiment;

DETAILED DESCRIPTION OF EMBODIMENTS

Hereinafter, embodiments for embodying the present disclosure (hereinafter, referred to as "embodiments") will be described. In addition, the description will be made in the following order:
1. Schematic Configuration Example of CMOS Type Solid-State Imaging Apparatus
2. first Embodiment (Case (1) of Back Irradiation Type Solid-State Imaging Apparatus)
3. Second Embodiment (Case (2) of Back Irradiation Type Solid-State Imaging Apparatus)
4. Third Embodiment (Case (1) of Surface Irradiation Type Solid-State Imaging Apparatus)
5. Fourth Embodiment (Case (2) of Surface Irradiation Type Solid-State Imaging Apparatus)
6. Fifth Embodiment (Case of Imaging Apparatus)
7. Modified Example

1. SCHEMATIC CONFIGURATION EXAMPLE OF CMOS TYPE SOLID-STATE IMAGING APPARATUS

Figure 1:
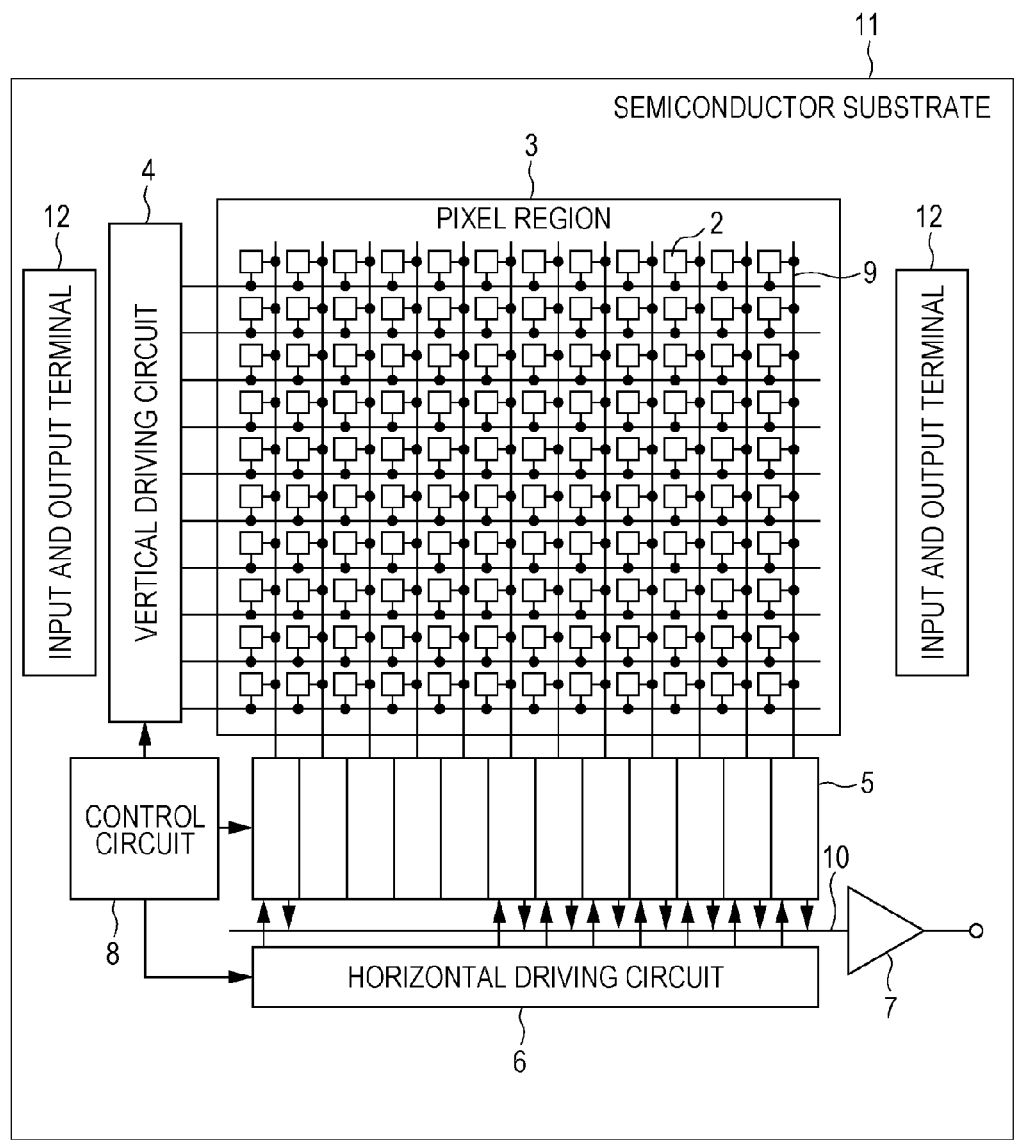
FIG. 1 is a schematic configuration diagram of an example of a CMOS type solid-state imaging apparatus that is applied to the respective embodiments of the present disclosure.

FIG. 1 shows a schematic configuration that is an example of a CMOS type solid-state imaging apparatus to be applied to the respective embodiments of the present disclosure. As shown in FIG. 1, the solid-state imaging apparatus 1 has a pixel region (a so-called imaging region) 3 in which pixels 2 including a plurality of photoelectric conversion elements are regularly arranged in a semiconductor substrate 11 (for example, silicon substrate) in a two-dimensional manner, and a peripheral circuit portion.

The pixels 2 have, for example, a photodiode becoming a photoelectric conversion element, and a plurality of pixel transistors (a so-called MOS transistor). The plurality of pixel transistors can be formed of three transistors, for example, a transmission transistor, a reset transistor, and an amplification transistor. In addition, the pixel transistors can also be formed of four transistors by adding a selection transistor.

Figure 19:
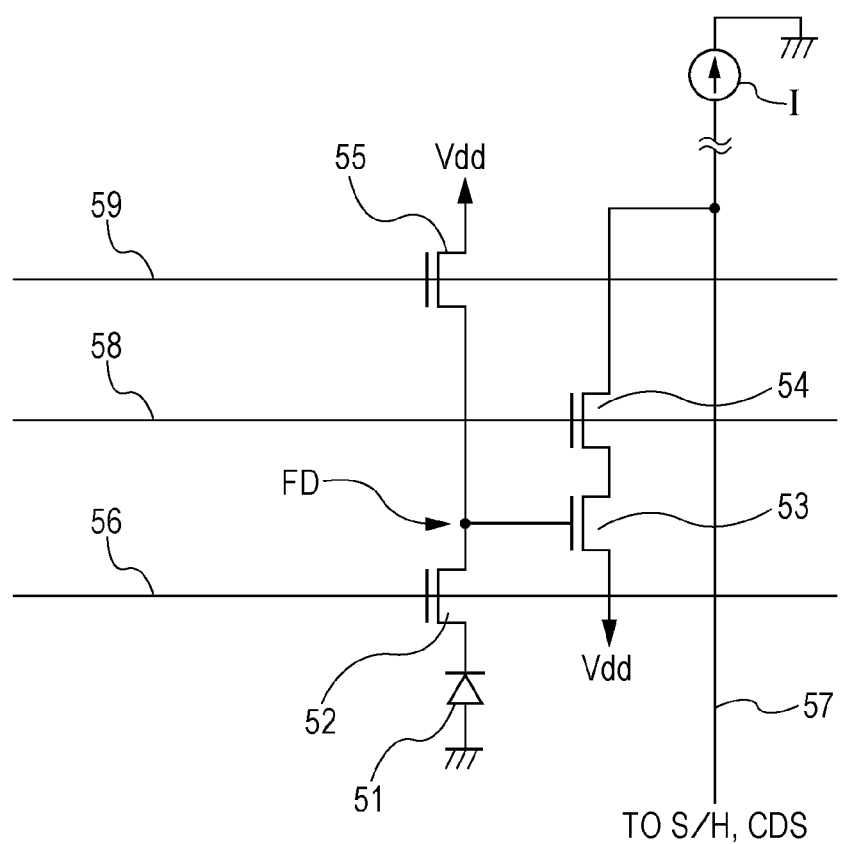
FIG. 19 is a schematic diagram for describing an example of a circuit configuration of a unit pixel.
Figure 20:
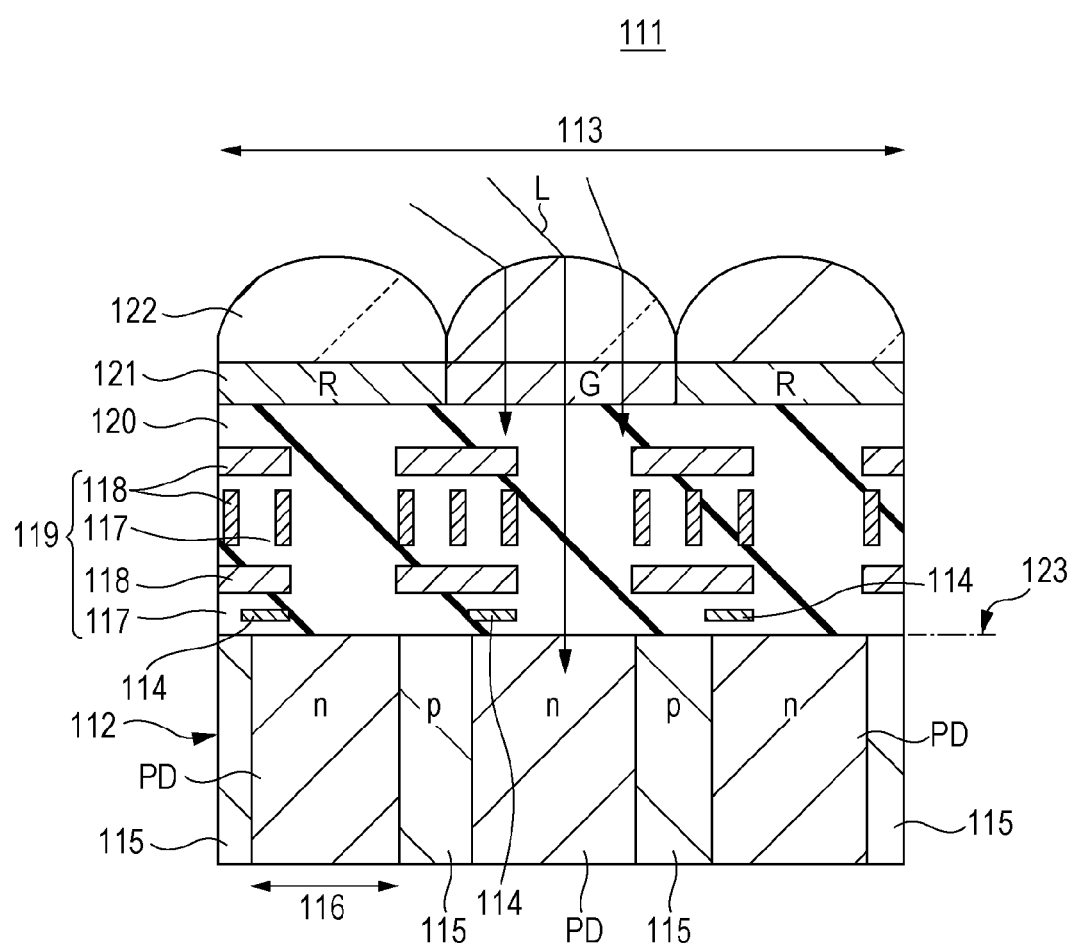
FIG. 20 is a schematic diagram for describing a CMOS type solid-state imaging apparatus (a surface irradiation type) of the related art.
Figure 21:
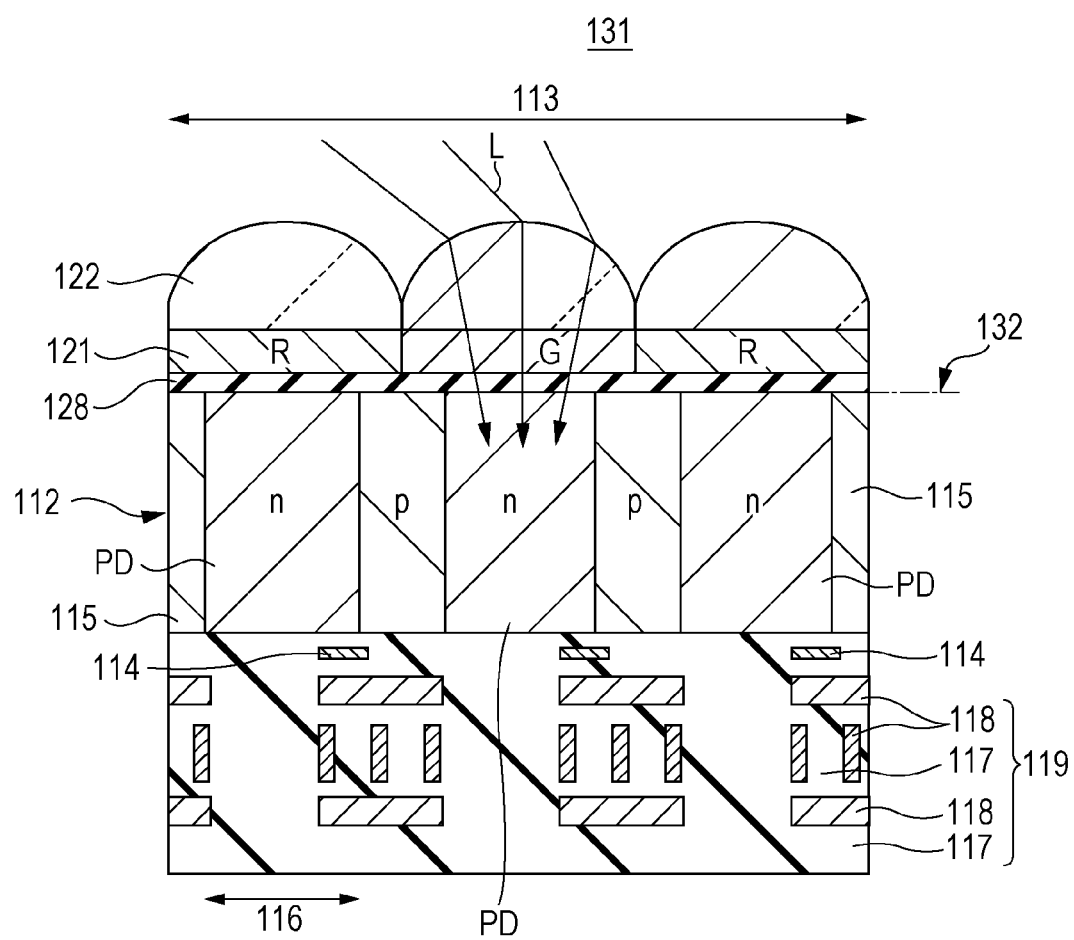
FIG. 21 is a schematic diagram for describing a CMOS type solid-state imaging apparatus (a back irradiation type) of the related art.
Figure 22:
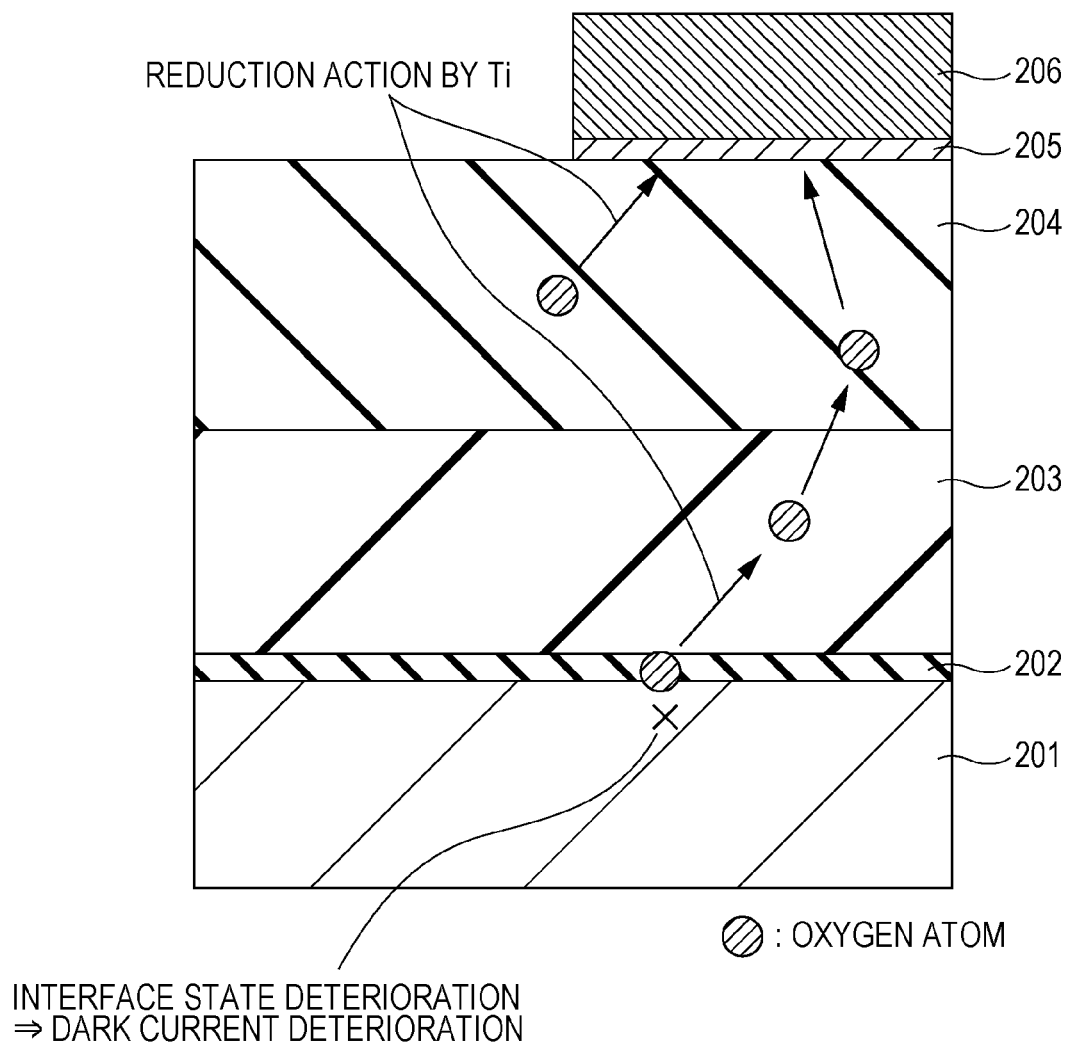
FIG. 22 is a schematic diagram for describing a structure of the back irradiation type solid-state imaging apparatus of the related art.

FIG. 19 is a schematic diagram for describing an example of a circuit configuration of the unit pixel of the pixels 2. The unit pixel has, for example, a photodiode 51 as the photoelectric conversion element, and has four transistors: a transmission transistor 52, an amplification transistor 53, an address transistor 54, and a reset transistor 55 as active elements with respect to the one photodiode 51.

The photodiode 51 performs the photoelectric conversion of the incident light into a positive electric charge (herein, electrons) depending on the quantity of light. The transmission transistor 52 is connected between the photodiode 51 and a floating diffusion FD. Moreover, a driving signal is given to a gate (a transmission gate) of the transmission transistor through a driving wiring 56, whereby the electrons subjected to the photoelectric conversion in the photodiode 51 are transmitted to the floating diffusion FD.

The gate of the amplification transistor 53 is connected to the floating diffusion FD. The amplification transistor 53 is connected to a vertical signal line 57 via the address transistor 54, thereby constituting a constant current source I and a source follower out of the pixel portion. When the address signal is given to the gate of the address transistor 54 through the driving wiring 58 and the address transistor 54 is turned on, the amplification transistor 53 amplifies the electric potential of the floating diffusion FD and outputs the voltage depending on the electric potential to the vertical signal line 57. The voltages output from the respective pixels are output to an S/H·CDS circuit through the vertical signal line 57.

The reset transistor 55 is connected between the power source Vdd and the floating diffusion FD. The reset signal is given to the gate of the reset transistor 55 through the driving wiring 59, whereby the electric potential of the floating diffusion FD is reset to the power source electric potential Vdd.

Since the respective gates of the transmission transistor 52, the address transistor 54, and the reset transistor 55 are connected by a line, such an operation is concurrently performed on each pixel of one line.

Furthermore, the pixels 2 are also capable of adopting a shared pixel structure. The shared pixel structure is formed of a plurality of photodiodes, a plurality of transmission transistors, one shared floating diffusion and other pixel transistors shared one by one.

The peripheral circuit portion has a vertical driving circuit 4, a column signal processing circuit 5, a horizontal driving circuit 6, an output circuit 7, a control circuit 8 or the like.

The control circuit 8 receives an input clock and data commanding an operation mode or the like, and outputs data such as internal information of the solid-state imaging apparatus. That is, in the control circuit 8, based on a vertical synchronizing signal, a horizontal synchronizing signal, and a master clock, the clock signal or the control signal is created which becomes the standard of the operation of the vertical driving circuit 4, the column signal processing circuit 5, and the horizontal driving circuit 6 or the like. Moreover, such a signal is input to the vertical driving circuit 4, the column signal processing circuit 5, the horizontal driving circuit 6 or the like.

The vertical driving circuit 4 is, for example, formed of a shift register, selects the pixel driving wiring, supplies pulse for driving the pixel to the selected pixel driving wiring, and drives the pixel by the row. That is, the vertical driving circuit 4 sequentially selects and scans the respective pixels 2 of the pixel region 3 by the row in a vertical direction, and supplies the pixel signal based on the signal electric charge created depending on the light reception amount, for example, in the photodiode becoming the photoelectric conversion element of each pixel 2 to the column signal processing circuit 5 through the vertical signal line 9.

The column signal processing circuit 5 is, for example, disposed for each row of the pixel 2, and performs the signal processing such as a noise removal of the signal to be output from the pixel 2 of the one column for each pixel row. That is, the column signal processing circuit 5 performs the signal processing such as a CDS, a signal amplification, and an AD conversion for removing the fixed pattern noise peculiar to the pixel 2. A horizontal selection switch (not shown) is connected and provided between the output stage of the column signal processing circuit 5 and the horizontal signal line 10.

The horizontal driving circuit 6 is formed, for example, of a shift register, sequentially selects each of the column signal processing circuit 5 by sequentially outputting the horizontal scanning pulse, and outputs the pixel signal from each of the column signal processing circuit 5 to the horizontal signal line 10.

The output circuit 7 performs the signal processing of the signal to be sequentially supplied from each of the column signal processing circuit 5 through the horizontal signal line 10 and outputs the signal. For example, in some cases, only the buffering is performed, and the black level adjustment, the row irregularity correction, various digital signal processes or the like are performed. The input and output terminal 12 exchanges the signal with the outside.

2. FIRST EMBODIMENT

Configuration Example of Solid-State Imaging Apparatus

Figure 2:
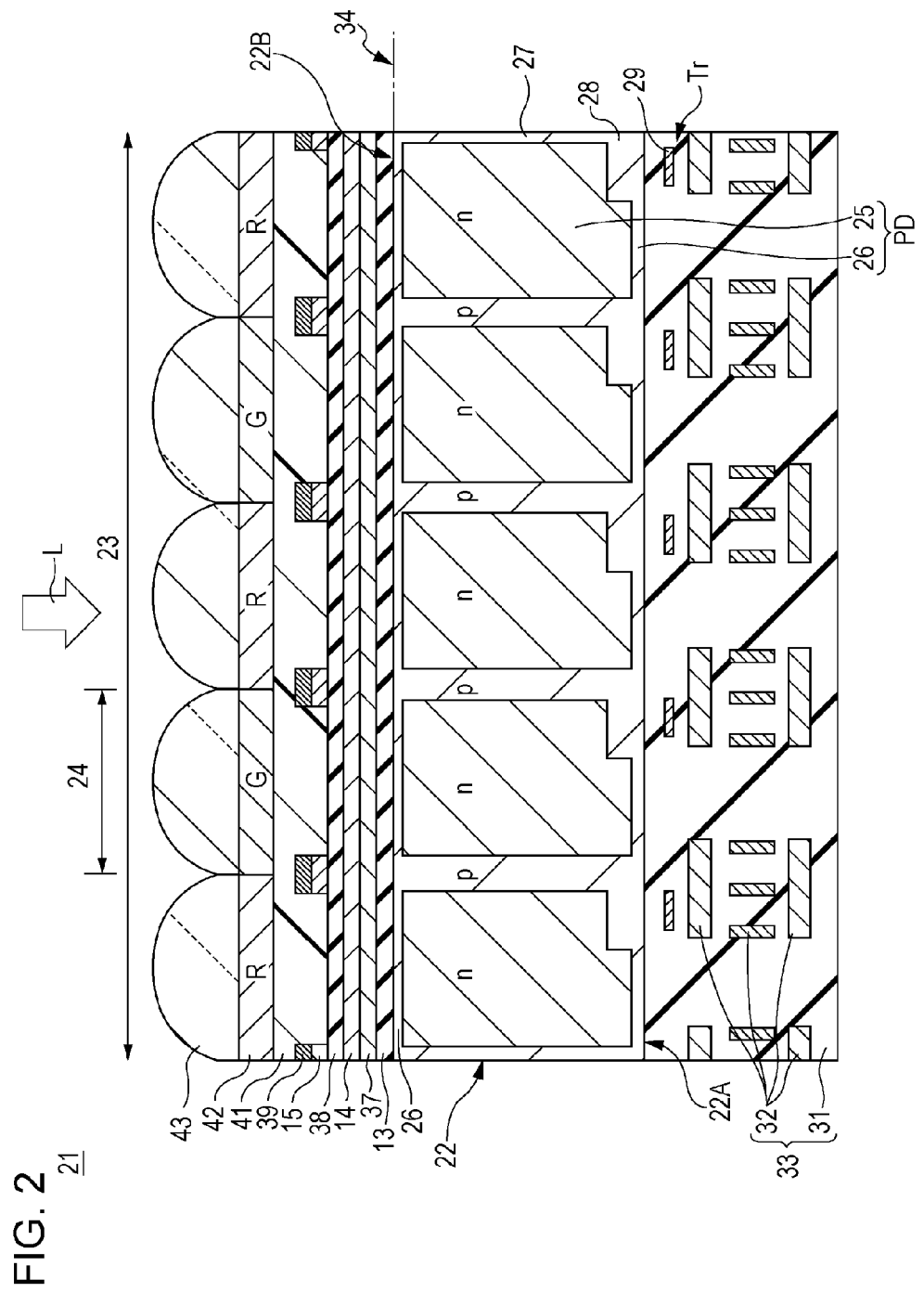
FIG. 2 is a schematic diagram for describing a first embodiment of the solid-state imaging apparatus according to an embodiment of the present disclosure.

FIG. 2 is a schematic diagram for describing a first embodiment of the solid-state imaging apparatus according to an embodiment of the present disclosure. The solid-state imaging apparatus of the present embodiment is a CMOS type solid-state imaging apparatus of a back irradiation type. A solid-state imaging apparatus 21 according to the first embodiment is configured by forming a pixel region (a so-called imaging region) 23, in which a plurality of pixels is arranged on a semiconductor substrate 22, for example, formed of silicon, and a peripheral circuit portion (not shown) disposed around the pixel region 23.

A unit pixel 24 includes a photodiode PD becoming a photoelectric conversion portion, and a plurality of pixel transistors Tr. The photodiode PD is formed over the entire region in a thickness direction of the semiconductor substrate 22, and is configured as a pn bonding type photodiode by an n type semiconductor region 25 and a p type semiconductor region 26 facing both sides of the front and back of the substrate. In addition, the p type semiconductor region facing both sides of the front and back of the substrate also functions as a positive hole electric charge accumulation region for suppressing the dark current.

Each pixel 24 including the photodiode PD and the pixel transistor Tr is separated by an element separation region 27 formed in the p type semiconductor region. The pixel transistor Tr forms n type source region and a n type drain region (neither of them are shown) in a p type semiconductor well region 28 formed on a surface 22A side of the semiconductor substrate 22, and forms a gate electrode 29 on the substrate surface between both regions via a gate insulation film. In addition, in FIG. 2, a plurality of pixel transistors is represented and shown by one pixel transistor Tr and is schematically shown by the gate electrode 29.

On the surface 22A of the semiconductor substrate 22, a so-called multilayer wiring layer 33 is formed which is formed by disposing a plurality of wirings 32 via an interlayer insulation film 31. Since the multilayer wiring layer 33 is not optically incident, the layout of the wiring 32 can be freely set.

On the substrate back 22B that is a light reception surface 34 of the photodiode PD, an oxide film 13 is formed, and a reflection preventing film 37 formed of SiON is formed on the oxide film 13. Furthermore, on the reflection preventing film 37, a metal oxide film 14 formed of $Ta_2O_5$ and an oxide film 38 formed of $SiO_2$ as an insulation layer are formed. In addition, in the first embodiment, the metal oxide film 14 is formed in an approximately entire surface on the reflection preventing film 37.

Furthermore, in a pixel boundary on the oxide film 38, that is, in a portion corresponding to a pixel boundary, a light shielding film 39 formed of tungsten (W) is formed via an adhesion layer 15 formed of Ti. In addition, the light shielding film 39 may be a material that shields light, but is preferably a material which has a strong light shielding property and can be worked accurately by minute working, for example, etching.

Furthermore, a planarization film 41 is formed on the oxide film 38 including the adhesion layer 15 and the light shielding film 39, and an on-chip color filter 42 and an on-chip micro lens 43 are sequentially formed on the planarization film 41. In addition, the planarization film 41 can be formed of, for example, an organic material such as resin, and, as the on-chip color filter 42, for example, a color filter of a Bayer arrangement can be used. Furthermore, the on-chip micro lens 43 can be formed of, for example, an organic material such as resin.

In addition, light L is incident from a substrate back 22B side, focused by the on-chip micro lens 43, and received by each photodiode PD.

In the back irradiation type solid-state imaging apparatus 21 according to the first embodiment, the metal oxide film 14 formed of $Ta_2O_5$, which shows an oxidation enthalpy smaller than that of $SiO_2$ forming the oxide film 13, is disposed between the oxide film 13 and the adhesion layer 15. Moreover, removing oxygen atoms from the metal oxide film 14 is more stable in view of a chemical reaction and energy, as compared to removing oxygen atoms of the oxide film 13. For that reason, for the oxide film 13, it is prevented that oxygen atoms are removed from Ti forming the adhesion layer 15, so that the interface layer between the oxide film 13 and the substrate back 22B is protected and is not damaged, whereby it is possible to suppress the generation of dark current due to the formation of the interface state.

In addition, in the first embodiment, the metal oxide film 14 is formed over approximately the entire surface on the reflection preventing film 37, whereby the oxide film 13 can be further satisfactorily protected, and a high effect concerning the suppression of the dark current generation can be expected.

MODIFIED EXAMPLE

Figure 3B:
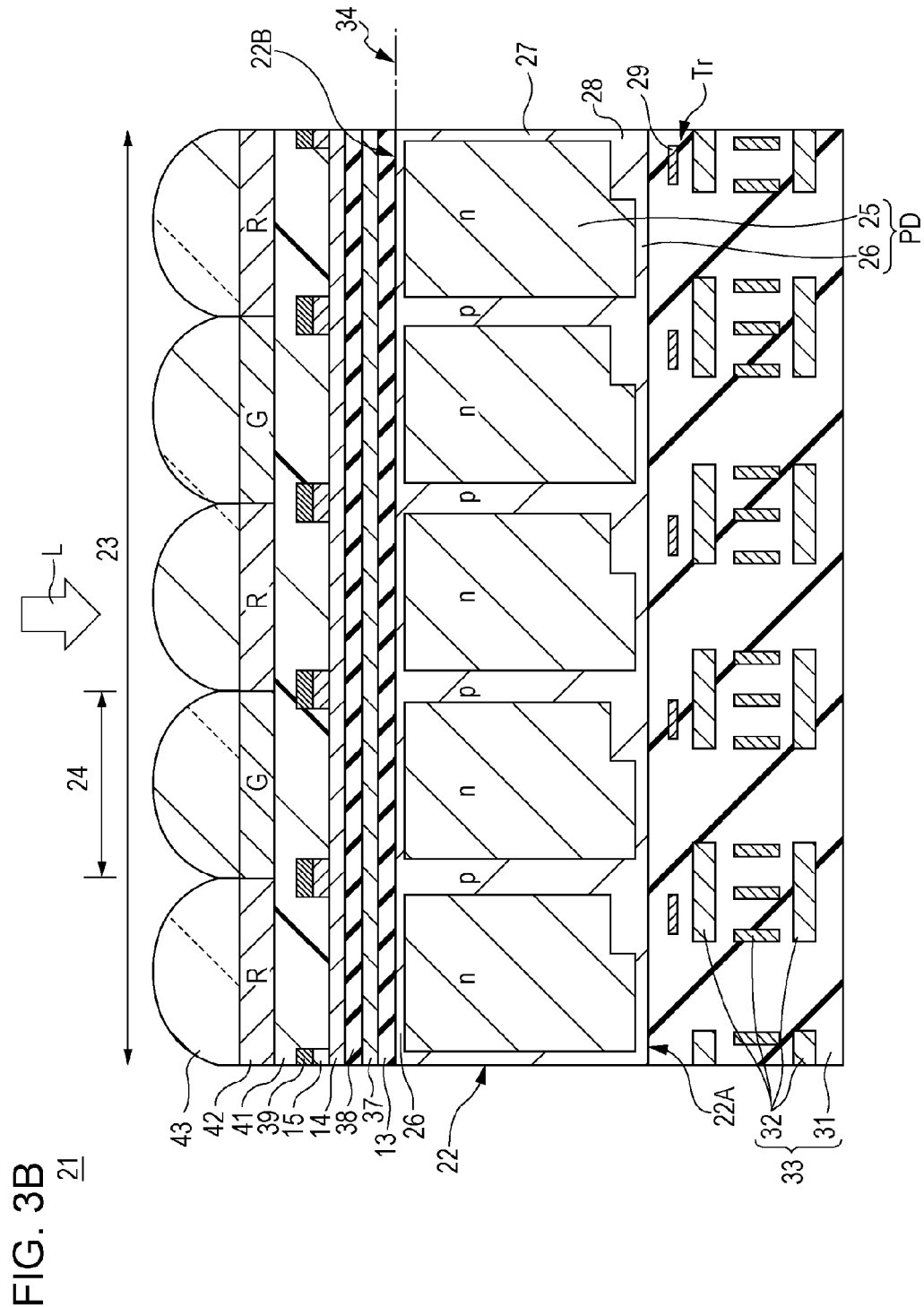
FIG. 3B is a schematic diagram (2) for describing a modified example of the first embodiment.

In the first embodiment, a case is described as an example where the metal oxide film 14 is formed on the upper layer of the reflection preventing film 37. However, it is sufficient that the metal oxide film 14 is formed between the oxide film 13 and the adhesion layer 15, and it is not necessary that the metal oxide film 14 is typically formed immediately over the reflection preventing film 37. For example, as shown in FIG. 3A, the metal oxide film 14 may be formed immediately over the oxide film 13, and, as shown in FIG. 3B, the metal oxide film 14 may be formed immediately over the oxide film 38.

Furthermore, in the first embodiment, a case is described as an example where a tantalum oxide ($Ta_2O_5$) layer is used as the metal oxide film 14, but it is not necessary to typically use a tantalum oxide ($Ta_2O_5$) layer. That is, it is sufficient that the metal oxide film 14 is formed of a material which shows the oxidation enthalpy smaller than that of the material (in the case of the present embodiment, $SiO_2$) forming the oxide film 13, and it is not necessary that the metal oxide film 14 is typically formed of a tantalum oxide ($Ta_2O_5$) layer. For example, the metal oxide film 14 may be formed of niobium oxide ($Nb_2O_5$), vanadium oxide ($V_2O_3$), chromium oxide ($Cr_2O_3$), tungsten oxide ($WO_2$), molybdenum oxide ($MoO_2$) or the like. In addition, if the metal oxide film 14 is formed of a material that shows the oxidation enthalpy smaller than that of the material forming the oxide film 13, it is not necessary that the material is an oxide.

In addition, a magnitude correlation of the oxidation enthalpy is as below.

$Al_2O_3 > HfO_2 > ZrO_2 > TiO_2 > SiO_2 > Ta_2O_5 > Nb_2O_5 > V_2O_3 > Cr_2O_3 > WO_3 > MoO_2$

As described above, although it is not necessary that the metal oxide film 14 is typically formed of a tantalum oxide ($Ta_2O_5$) layer, in the case of the present embodiment, it is necessary that the metal oxide film 14 is formed of a material having excellent light transmittance. That is, in the first embodiment, since the metal oxide film 14 is formed over approximately the entire surface of the upper layer of the reflection preventing film 37, in other words, the metal oxide film 14 is also formed on the upper layer of the efficient pixel region, it is necessary that the metal oxide film 14 is formed of a material having excellent light transmittance.

Herein, table 1 shows "light transmission region of representative oxide material", and table 2 shows "band energy gap of representative oxide material". However, the numerical values shown in table 1 are an example, and since the transmittance differs depending on the film forming method or film forming condition, the numerical values are not determined uniquely.

TABLE 1

| material | light transmission region (um) | film forming method |
|---|---|---|
| $Al_2O_3$ | 0.2 to 8 | CVD, sputter |
| $HfO_2$ | 0.23 to 12 | CVD, sputter |
| $ZrO_2$ | 0.3 to 8 | CVD, sputter |
| $TiO_2$ | 0.35 to 12 | sputter |
| $SiO_2$ | 0.16 to 8 | CVD |
| $Ta_2O_5$ | 0.35 to 10 | CVD, sputter |
| $Nb_2O_5$ | 0.32 to 8 | vapor deposition |
| $V_2O_3$ | thermal discoloration | sputter |
| $Cr_2O_3$ | 1.2 to 10 | vapor deposition |
| $WO_3$ | 0.4 to | vapor deposition |

TABLE 2

| material | band gap (eV) |
|---|---|
| $Al_2O_3$ | 8.8 |
| $HfO_2$ | 6.0 |
| $ZrO_2$ | 5.8 |
| $SiO_2$ | 9.0 |
| $Ta_2O_5$ | 4.4 |
| $Y_2O_3$ | 6.0 |

An optical absorption of a substance correlates with the energy band gap. When light is incident to a substance, since light equal to or greater than the energy equivalent to the band gap is absorbed, the substance having the band gap of about 3 eV (electron volt) or more becomes transparent. As shown in table 2, generally, an oxide is a wide gap material having a large energy band gap, and as shown in table 1, since an oxide transmits most visible rays, the oxide may be transparent. For that reason, as mentioned above, materials such as tantalum oxide ($Ta_2O_5$), niobium oxide ($Nb_2O_5$), vanadium oxide ($V_2O_3$), chromium oxide ($Cr_2O_3$), and tungsten oxide ($WO_2$) may be considered as light transmissive materials except for chromium oxide. Furthermore, even in a case where absorption exists in the visible ray region like chromium oxide, it is possible to apply the material to a device by optimizing the film thickness to adjust the amount of light incident to the photodiode.

Furthermore, from the viewpoint of suppressing the reflection of light to the interface with the reflection preventing film 37, the optical transmittance of the metal oxide film 14 is equal to or more than 80%, and the refractive index is preferably equal to or less than or equivalent to that of the reflection preventing film 37 (specifically, about 1.5 to 2.5).

In addition, the refractive indexes of each material described above are as shown in table 3. However, the numerical values described below are an example, and the refractive indexes differ depending on the wavelength of the light source or the film forming condition, and thus the numerical values are not determined uniquely as in the transmission region mentioned above.

TABLE 3

| material | refractive index | light source wavelength (nm) |
|---|---|---|
| $Al_2O_3$ | 1.76 | 633 |
| $HfO_2$ | 2.05 | 633 |
| $ZrO_2$ | 2.05 | 500 |
| $TiO_2$ | 2.52 to 2.71 | 633 |
| $SiO_2$ | 1.45 | 633 |
| $Ta_2O_5$ | 2.15 | 633 |
| $Nb_2O_5$ | 2.1 to 2.3 | 320 to 8000 |
| $V_2O_3$ | 2.2 to 2.5 | 550 |
| $Cr_2O_3$ | 2.24 to | 700 |
| $WO_3$ | 2.2 | 550 |
| $MoO_2$ | 1.8 to 2.5 | 656 |

Example of Manufacturing Method of Solid-State Imaging Apparatus

FIGS. 4A, 4B, 5A, and 5B show a manufacturing method of the solid-state imaging apparatus 21 of the first embodiment. FIGS. 4A, 4B, 5A, and 5B show only sectional structures of major parts with a part of the substrate surface side omitted. In addition, the reference numerals of the omitted portions refer to FIG. 2.

In the manufacturing method of the solid-state imaging apparatus 21 of the first embodiment, firstly, in a region where a pixel region of the semiconductor substrate 22 of silicon should be formed, the photodiode PD is formed which corresponds to each pixel separated by the element separation region 27 by the p type semiconductor region.

In addition, the photodiode PD has a pn joining that includes an n type semiconductor region 25 over the entire region of the substrate thickness direction and a p type semiconductor region 26 which abuts against the n type semiconductor region 25 and faces both sides 22A and 22B of the front and back of the substrate.

In regions of the substrate surface 22A corresponding to each pixel, p type semiconductor well regions 28 abutting the element separation region 27 are formed, respectively, and a plurality of pixel transistors Tr is formed in the p type semiconductor well regions 28, respectively. In addition, the pixel transistors Tr are formed by a source region and a drain region, a gate insulation film, and the gate electrode 29, respectively.

Furthermore, in the upper portion of the substrate surface 22A, a multilayer wiring layer 33 with a plurality of layers of wiring 32 disposed thereon via the inter-layer insulation film 31 is formed.

In addition, on the substrate back 22B, a chemical oxide film (the oxide film 13) is formed by the chemical solution processing.

Figure 4A:
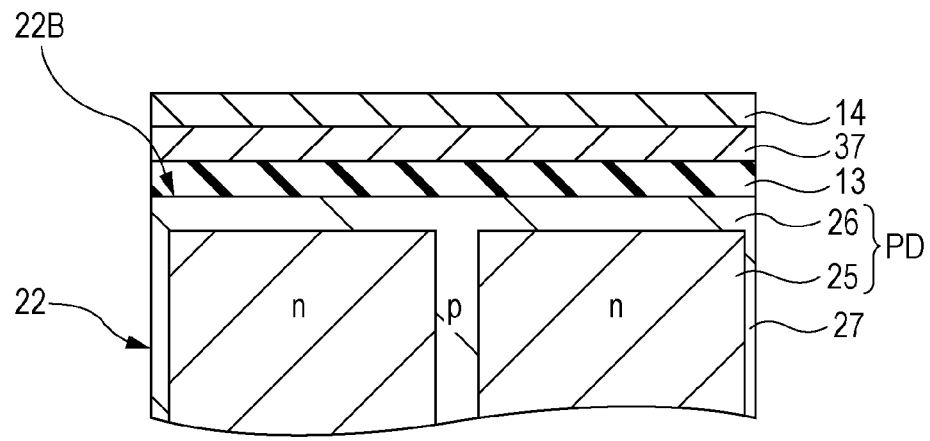
FIGS. 4A and 4B are schematic diagrams (1) for describing a manufacturing method of the solid-state imaging apparatus of the first embodiment.

Next, as shown in FIG. 4A, on the substrate back 22B becoming the light reception surface, SiON as the reflection preventing film 37 is formed by a CVD method, and $Ta_2O_5$ is formed as the metal oxide film 14.

In addition, herein, the metal oxide film 14 is deposited by a reactive sputtering method using a mixed gas of oxygen gas and argon gas, the film formation temperature is the room temperature to 400° C., and the film thickness is about 1 nm to 100 nm.

Next, on the upper layer of the metal oxide film 14, $SiO_2$ as the oxide film 38 is formed by the CVD method, a laminated film of titanium/tungsten is formed as the adhesion layer 15 and the light shielding film 39. In addition, tungsten and titanium becoming the adhesion layer 15 and the light shielding film 39 are deposited by a general-purpose sputtering method, the film formation temperature is from room temperature to 400° C., and the film thickness of titanium is about 5 nm to 50 nm, and the film thickness of tungsten is about 100 nm to 300 nm.

Herein, the adhesion layer 15 may be titanium nitride (TiN) as well as titanium. In this case, the adhesion layer 15 can be formed by the reactive sputtering method under the atmosphere in which nitrogen gas is mixed with argon gas during PVD film formation.

Figure 4B:
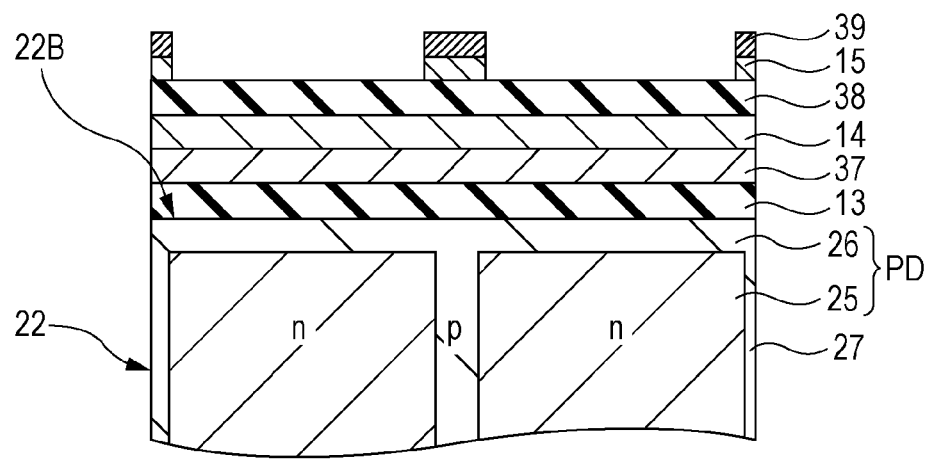

Next, the pattern working is performed so that a visible ray induction opening portion can be formed in the region corresponding to the photodiode PD (see FIG. 4B). The pattern working selectively etches and removes the adhesion layer 15 and the light shielding film 39 via a register mask (not shown), and forms the adhesion layer 15 and the light shielding film 39 in each pixel boundary. In addition, the etching can be a wet etching or a dry etching, and the dry etching can accurately obtain a minute line width of the light shielding film 39.

Figure 5A:
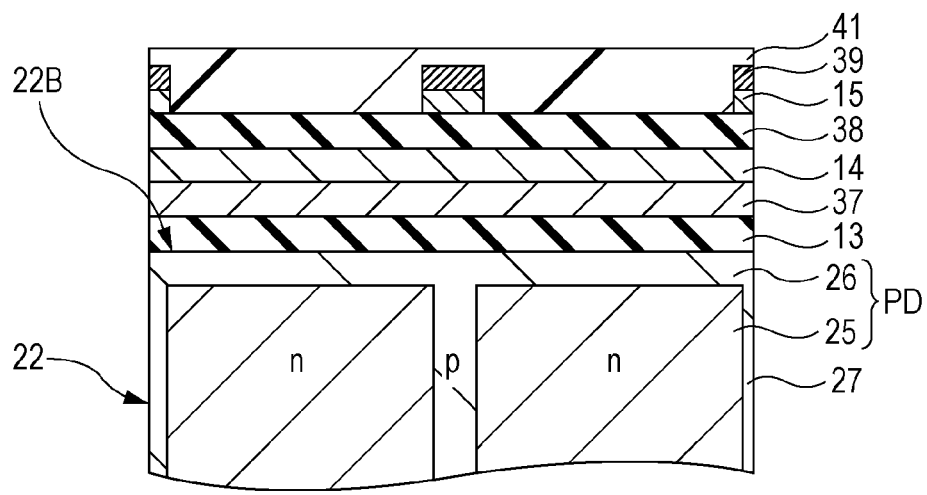
FIGS. 5A and 5B are schematic diagrams (2) for describing a manufacturing method of the solid-state imaging apparatus of the first embodiment.

Next, as shown in FIG. 5A, the planarization film 41 is formed on the oxide film 38 including the light shielding film 39. The planarization film 41 is formed, for example, by applying an organic material such as resin.

Figure 5B:
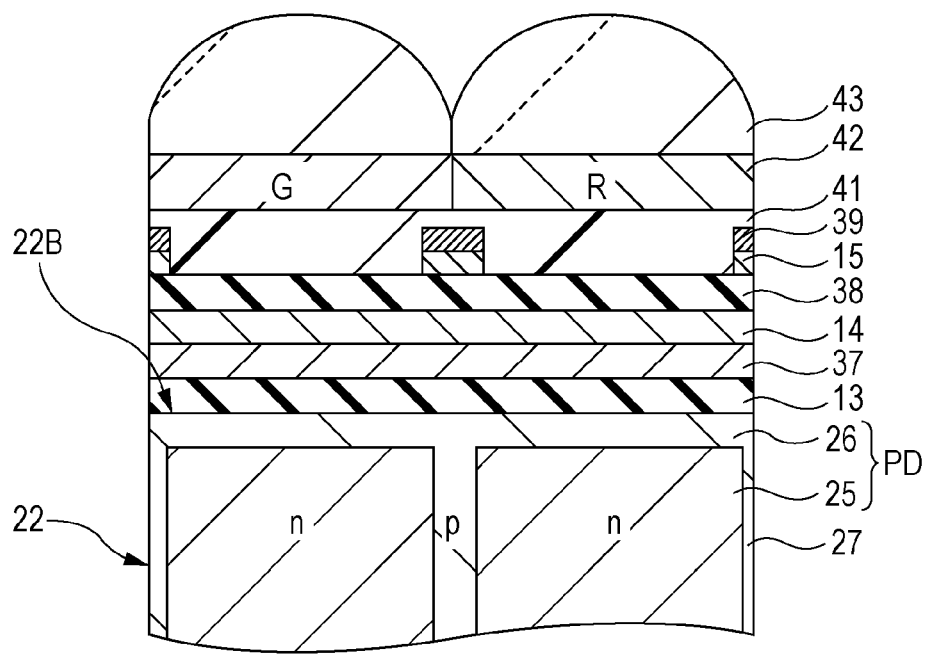

Next, as shown in FIG. 5B, for example, the on-chip color filter 42 and the on-chip micro lens 43 of a Bayer arrangement are sequentially formed on the planarization film 41. In this manner, the solid-state imaging apparatus 21 of the first embodiment as shown in FIG. 2 can be obtained.

3. SECOND EMBODIMENT

Configuration Example of Solid-State Imaging Apparatus

Figure 6:
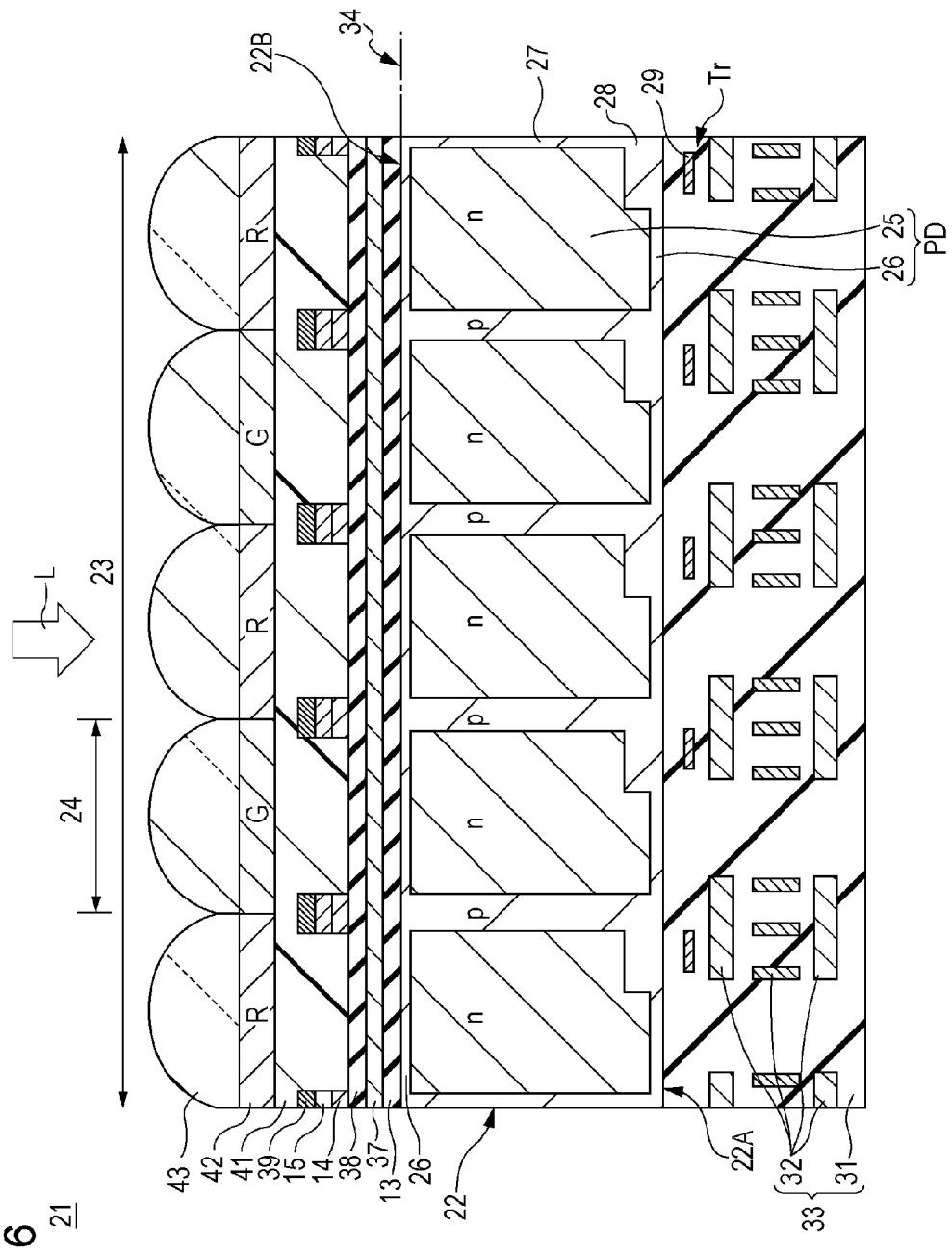
FIG. 6 is a schematic diagram for describing a second embodiment of the solid-state imaging apparatus according to an embodiment of the present disclosure.

FIG. 6 is a schematic diagram for describing a second embodiment of the solid-state imaging apparatus according to an embodiment of the present disclosure. The solid-state imaging apparatus of the present embodiment is a CMOS type solid-state imaging apparatus of a back irradiation type. A solid-state imaging apparatus 21 according to the second embodiment is configured by forming a pixel region (a so-called imaging region) 23, where a plurality of pixels is arranged on a semiconductor substrate 22, for example, formed of silicon, and a peripheral circuit portion (not shown) disposed around the pixel region 23.

A unit pixel 24 includes a photodiode PD becoming a photoelectric conversion portion, and a plurality of pixel transistors Tr. The photodiode PD is formed over the entire region of a thickness direction of the semiconductor substrate 22, and is configured as the pn bonding type photodiode by the n type semiconductor region 25 and the p type semiconductor region 26 facing the front and back of the substrate. In addition, the p type semiconductor region facing both sides of the front and back of the substrate also functions as a positive hole electric charge accumulation region for suppressing the dark current.

Each pixel 24 including the photodiode PD and the pixel transistor Tr is separated by the element separation region 27 formed in the p type semiconductor region. The pixel transistor Tr forms an n type source region and a drain region (neither of them are shown) in the p type semiconductor well region 28 formed on a surface 22A side of the semiconductor substrate 22, and forms a gate electrode 29 on the substrate surface between both regions via a gate insulation film. In addition, in FIG. 6, a plurality of pixel transistors is represented and shown by one pixel transistor Tr and is schematically shown by the gate electrode 29.

On the surface 22A of the semiconductor substrate 22, a so-called multilayer wiring layer 33 is formed which is formed by disposing a plurality of wirings 32 via the inter-layer insulation film 31. Since the multilayer wiring layer 33 is not optically incident, a layout of the wiring 32 can be freely set.

On the substrate back 22B that is a light reception surface 34 of the photodiode PD, an oxide film 13 is formed, and a reflection preventing film 37 formed of SiON is formed on the oxide film 13. Furthermore, on the reflection preventing film 37, an oxide film 38 formed of $SiO_2$ as an insulation layer is formed.

Furthermore, in a pixel boundary on the oxide film 38, that is, in a portion corresponding to a pixel boundary, a light shielding film 39 formed of tungsten (W) is formed via the metal oxide film 14 formed of $Ta_2O_5$ and the adhesion layer 15 formed of Ti. In addition, in the second embodiment, the metal oxide film 14 is formed only in a portion corresponding to the pixel boundary. Furthermore, the light shielding film 39 may be a material that shields light, but is preferably a material which has a strong light shielding property and can be worked accurately by minute working, for example, etching.

Furthermore, a planarization film 41 is formed on the oxide film 38 including the metal oxide film 14, the adhesion layer 15 and the light shielding film 39, and an on-chip color filter 42 and an on-chip micro lens 43 are sequentially formed on the planarization film 41. In addition, the planarization film 41 can be formed of, for example, an organic material such as resin, and, as the on-chip color filter 42, for example, a color filter of a Bayer arrangement can be used. Furthermore, the on-chip micro lens 43 can be formed of, for example, an organic material such as resin.

In addition, light L is incident from a substrate back 22B side, focused by the on-chip micro lens 43, and received by each photodiode PD.

In the back irradiation type solid-state imaging apparatus 21 according to the second embodiment, the metal oxide film 14 formed of $Ta_2O_5$, which shows an oxidation enthalpy smaller than that of $SiO_2$ forming the oxide film 13, is disposed between the oxide film 13 and the adhesion layer 15. Moreover, removing oxygen atoms from the metal oxide film 14 is more stable in view of a chemical reaction and energy, as compared to removing oxygen atoms of the oxide film 13. For that reason, it is suppressed that the interface layer between the oxide film 13 and the semiconductor substrate 22 removes oxygen atoms of Ti forming the adhesion layer 15, so that the oxide film 13 is protected and is not damaged, whereby it is possible to suppress the generation of dark current due to the formation of the interface state.

In addition, in the second embodiment, the metal oxide film 14 is formed only in the portion corresponding to the pixel boundary, and the structure of the efficient pixel region is the same as that of the common solid-state imaging apparatus (a solid-state imaging apparatus in which the metal oxide film 14 is not formed). For that reason, the transmittance or the refractive index of the material forming the metal oxide film 14 may be anything, whereby the degree of freedom of the material selection or the film forming condition is high and restrictions on the integration are few. Thus, it is possible to build the stable manufacturing process with wider process window conditions.

MODIFIED EXAMPLE

In the second embodiment, a case is described as an example where a tantalum oxide ($Ta_2O_5$) layer is used as the metal oxide film 14, but it is not necessary to typically use a tantalum oxide ($Ta_2O_5$) layer. That is, it is sufficient that the metal oxide film 14 is formed of a material which shows the oxidation enthalpy smaller than that of the material (in the case of the present embodiment, $SiO_2$) forming the oxide film 13, and it is not necessary that the metal oxide film 14 is typically formed of a tantalum oxide ($Ta_2O_5$) layer. For example, the metal oxide film 14 may be formed of niobium oxide ($Nb_2O_5$), vanadium oxide ($V_2O_3$), chromium oxide ($Cr_2O_3$), tungsten oxide ($WO_2$), molybdenum oxide ($MoO_2$) or the like. In addition, if the metal oxide film 14 is formed of a material that shows the oxidation enthalpy smaller than that of the material forming the oxide film 13, it is also not necessary that the material is an oxide.

Example of Manufacturing Method of Solid-State Imaging Apparatus

FIGS. 7A, 7B, 8A and 8B show a manufacturing method of the solid-state imaging apparatus 21 of the second embodiment. FIGS. 7A, 7B, 8A and 8B show only sectional structures of major parts with a part of the substrate surface side omitted. In addition, the reference numerals of the omitted portions refer to FIG. 6.

In the manufacturing method of the solid-state imaging apparatus 21 of the second embodiment, firstly, in a region where a pixel region of the semiconductor substrate 22 of silicon should be formed, the photodiode PD is formed which corresponds to each pixel separated by the element separation region 27 by the p type semiconductor region.

In addition, the photodiode PD has a pn joining that includes an n type semiconductor region 25 over the entire region of the substrate thickness direction and a p type semiconductor region 26 which abuts against the n type semiconductor region 25 and faces both sides 22A and 22B of the front and back of the substrate.

In regions of the substrate surface 22A corresponding to each pixel, p type semiconductor well regions 28 abutting the element separation region 27 are formed, respectively, and a plurality of pixel transistors Tr is formed in the p type semiconductor well regions 28, respectively. In addition, the pixel transistors Tr are formed by a source region and a drain region, a gate insulation film, and the gate electrode 29, respectively.

Furthermore, in the upper portion of the substrate surface 22A, a multilayer wiring layer 33 with a plurality of layers of wiring 32 disposed thereon via the inter-layer insulation film 31 is formed.

In addition, on the substrate back 22B, a chemical oxide film (the oxide film 13) is formed by the chemical solution processing.

Figure 7A:
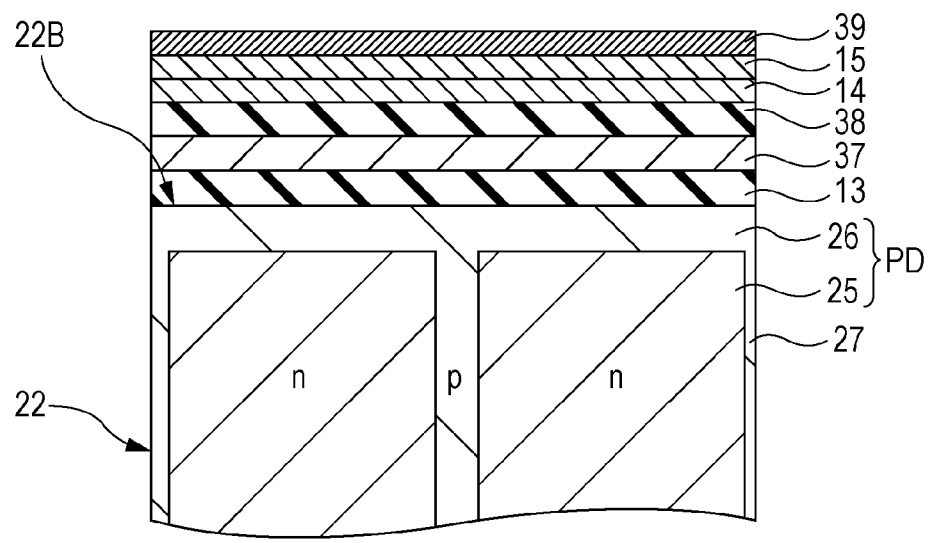
FIGS. 7A and 7B are schematic diagrams (1) for describing a manufacturing method of the solid-state imaging apparatus of the second embodiment.

Next, as shown in FIG. 7A, on the substrate back 22B becoming the light reception surface, SiON as the reflection preventing film 37 and $SiO_2$ as the oxide film 38 are formed by the CVD method, and $Ta_2O_5$ is formed as the metal oxide film 14.

In addition, herein, the metal oxide film 14 is deposited by a reactive sputtering method using a mixed gas of oxygen gas and argon gas, the film formation temperature thereof is from room temperature to 400° C., and the film thickness is about 1 nm to 100 nm.

Next, on the upper layer of the metal oxide film 14, a laminated film of titanium/tungsten becoming the adhesion layer 15 and the light shielding film 39 is formed. In addition, tungsten and titanium becoming the adhesion layer 15 and the light shielding film 39 are deposited by the sputtering method, the film formation temperature is from room temperature to 400° C., and the film thickness of titanium is about 5 nm to 50 nm, and the film thickness of tungsten is about 100 nm to 300 nm.

Herein, the adhesion layer 15 may be titanium nitride (TiN) as well as titanium. In this case, the adhesion layer 15 can be formed by the reactive sputtering method under the atmosphere in which nitrogen gas is mixed with argon gas during PVD film formation.

Figure 7B:
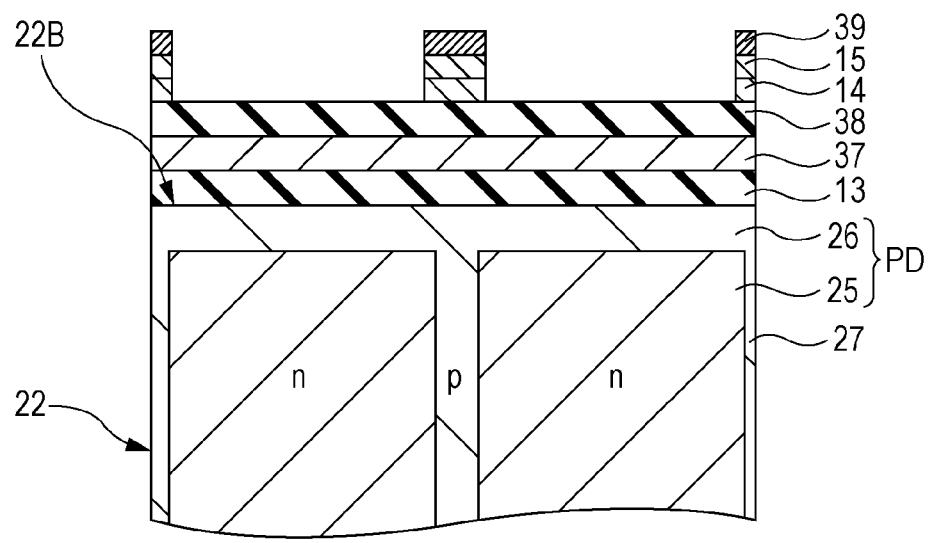

Next, the pattern working is performed so that a visible ray induction opening portion can be formed in the region corresponding to the photodiode PD (see FIG. 7B). The pattern working selectively etches and removes the metal oxide film 14, the adhesion layer 15 and the light shielding film 39 via a register mask (not shown), and forms the metal oxide film 14, the adhesion layer 15 and the light shielding film 39 in each pixel boundary. In addition, the etching can be a wet etching or a dry etching, and the dry etching can accurately obtain a minute line width of the light shielding film 39.

Figure 8A:
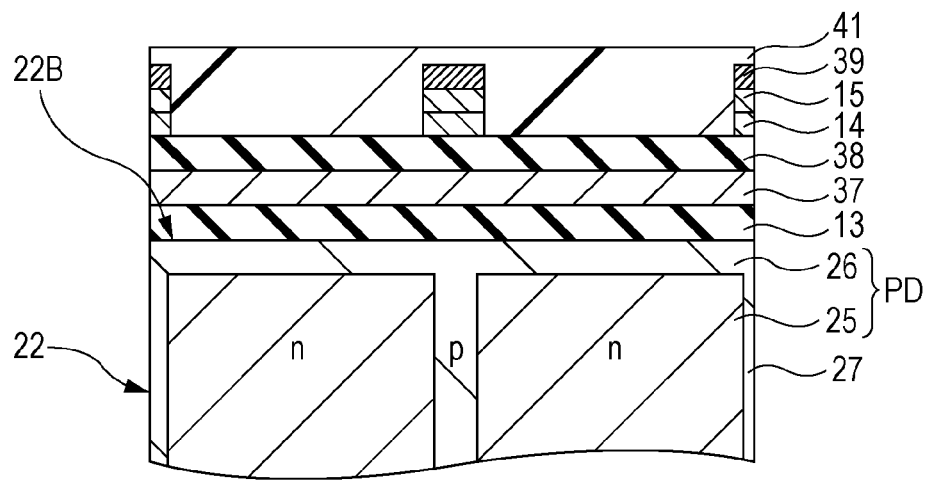
FIGS. 8A and 8B are schematic diagrams (2) for describing a manufacturing method of the solid-state imaging apparatus of the second embodiment.

Next, as shown in FIG. 8A, the planarization film 41 is formed on the oxide film 38 including the light shielding film 39. The planarization film 41 is formed, for example, by applying an organic material such as resin.

Figure 8B:
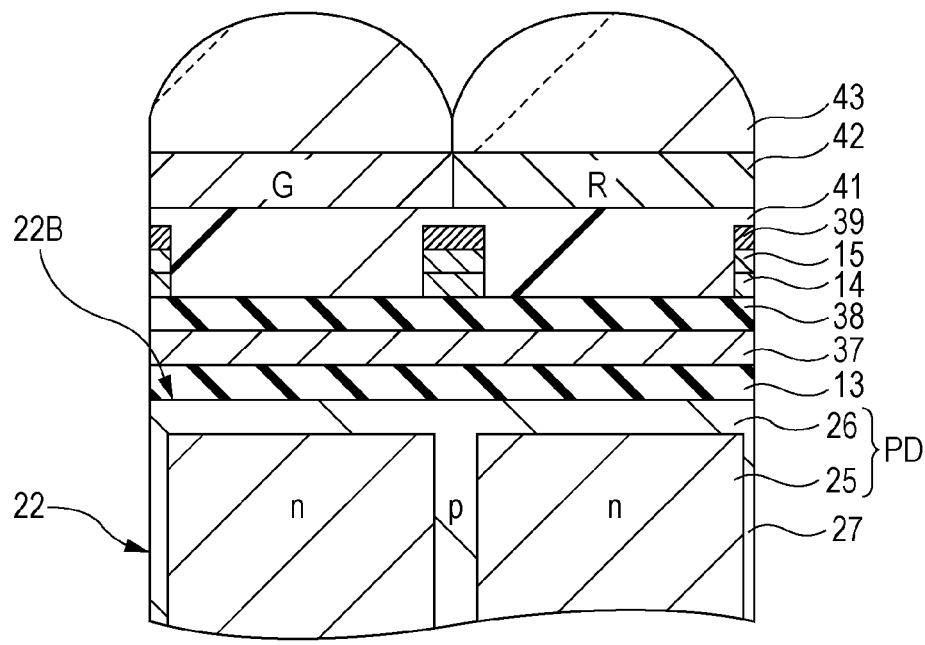

Next, as shown in FIG. 8B, the on-chip color filter 42 and the on-chip micro lens 43 of the Bayer arrangement are sequentially formed on the planarization film 41. In this manner, the solid-state imaging apparatus 21 of the second embodiment as shown in FIG. 6 can be obtained.

4. THIRD EMBODIMENT

Configuration Example of Solid-State Imaging Apparatus

Figure 9:
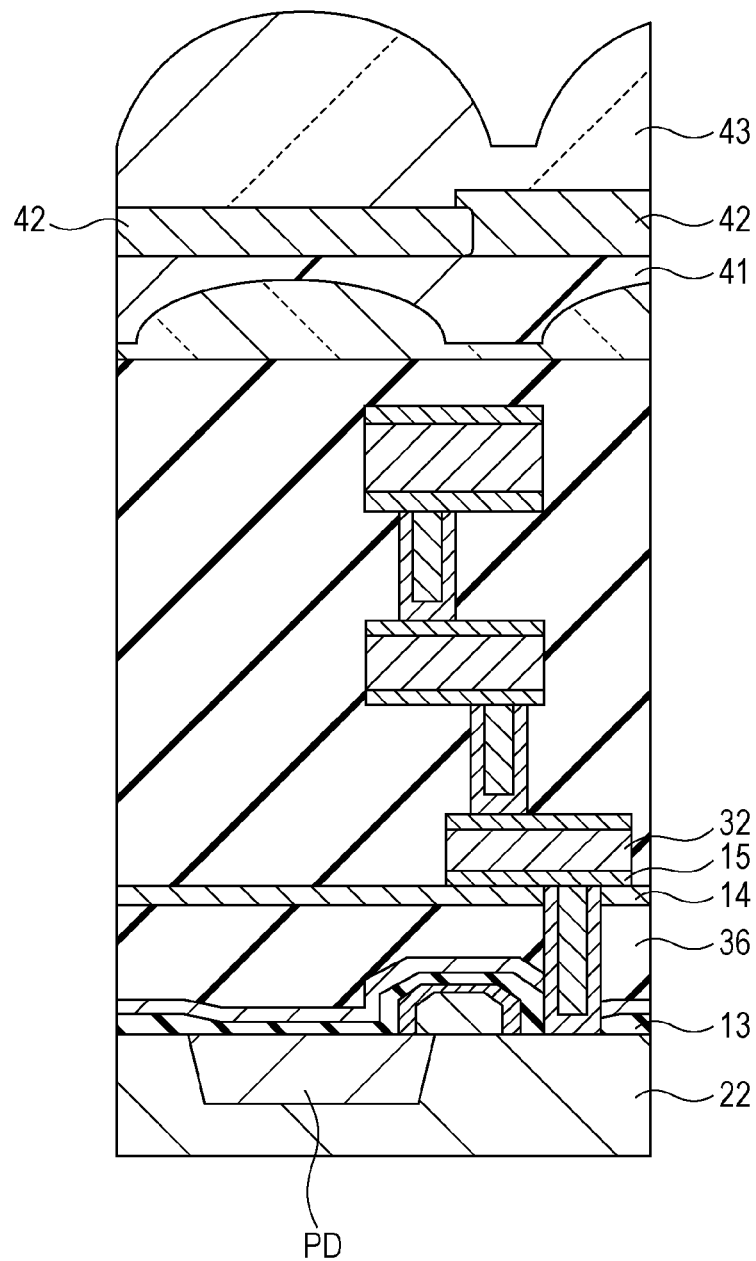
FIG. 9 is a schematic diagram for describing a third embodiment of a solid-state imaging apparatus according to an embodiment of the present disclosure.

FIG. 9 is a schematic diagram for describing a third embodiment of the solid-state imaging apparatus according to an embodiment of the present disclosure. The solid-state imaging apparatus of the present embodiment is a CMOS type solid-state imaging apparatus of a surface irradiation type. A solid-state imaging apparatus 85 according to the third embodiment is configured by forming a pixel region (a so-called imaging region), where a plurality of pixels is arranged on a semiconductor substrate 22, for example, formed of silicon, and a peripheral circuit portion disposed around the pixel region.

A unit pixel includes a photodiode PD becoming a photoelectric conversion portion, and a plurality of pixel transistors Tr. The photodiode PD is configured as a pn bonding type photodiode by an n type semiconductor region (not shown) and a p type semiconductor region (not shown).

Each pixel including the photodiode PD and the pixel transistor Tr is separated by an element separation region (not shown) formed in the p type semiconductor region. The pixel transistor Tr forms an n type source region and a drain region in a p type semiconductor well region formed on a surface side of the semiconductor substrate 22, and forms a gate electrode on the substrate surface between both regions via a gate insulation film.

On the surface becoming the light reception surface of the semiconductor substrate 22, an oxide film 13 is formed, and an inter-layer insulation film 36 is formed on the oxide film 13. Furthermore, on the inter-layer insulation film 36, the wiring 32 is formed on the upper layer via the metal oxide film 14 formed of $Ta_2O_5$ and the adhesion layer 15 formed of Ti. In addition, a plurality of wirings 32 is disposed via the inter-layer insulation film 36, and a so-called multilayer wiring layer is formed. In addition, in the third embodiment, the metal oxide film 14 is formed in approximately entire surface on the inter-layer insulation film 36.

Furthermore, a planarization film 41 is formed on the upper layer of the multilayer wiring layer, and an on-chip color filter 42 and an on-chip micro lens 43 are sequentially formed on the planarization film 41. In addition, the planarization film 41 can be formed of, for example, an organic material such as resin, and, as the on-chip color filter 42, for example, a color filter of a Bayer arrangement can be used. Furthermore, the on-chip micro lens 43 can be formed of, for example, an organic material such as resin.

In the surface irradiation type solid-state imaging apparatus 85 according to the third embodiment, the metal oxide film 14 formed of $Ta_2O_5$, which shows an oxidation enthalpy smaller than that of $SiO_2$ forming the oxide film 13, is disposed between the oxide film 13 and the adhesion layer 15. Moreover, removing oxygen atoms from the metal oxide film 14 is more stable in view of a chemical reaction and energy, as compared to removing oxygen atoms of the oxide film 13. For that reason, it is suppressed that the interface layer between the semiconductor substrate 22 and the oxide film 13 removes oxygen atoms from Ti forming the adhesion layer 15, so that the interface layer between the semiconductor substrate 22 and the oxide film 13 is protected and is not damaged, whereby it is possible to suppress the generation of dark current due to the formation of the interface state.

In addition, in the third embodiment, the metal oxide film 14 is formed over approximately the entire surface of the upper layer of the oxide film 13, whereby it is possible to further satisfactorily protect the interface layer between the semiconductor substrate 22 and the oxide film 13, and expect a high effect of the suppression of the dark current generation.

MODIFIED EXAMPLE

In the third embodiment, a case is described as an example where a tantalum oxide ($Ta_2O_5$) layer is used as the metal oxide film 14, but it is not necessary to typically use a tantalum oxide ($Ta_2O_5$) layer. That is, it is sufficient that the metal oxide film 14 is formed of a material which shows the oxidation enthalpy smaller than that of the material (in the case of the present embodiment, $SiO_2$) forming the oxide film 13 and it is not necessary that the metal oxide film 14 is typically formed of a tantalum oxide ($Ta_2O_5$) layer. For example, the metal oxide film 14 may be formed of niobium oxide ($Nb_2O_5$), vanadium oxide ($V_2O_3$), chromium oxide ($Cr_2O_3$), tungsten oxide ($WO_2$), molybdenum oxide ($MoO_2$) or the like. In addition, if the metal oxide film 14 is formed of a material that shows the oxidation enthalpy smaller than that of the material forming the oxide film 13, it is also not necessary that the material is an oxide.

Figure 10A:
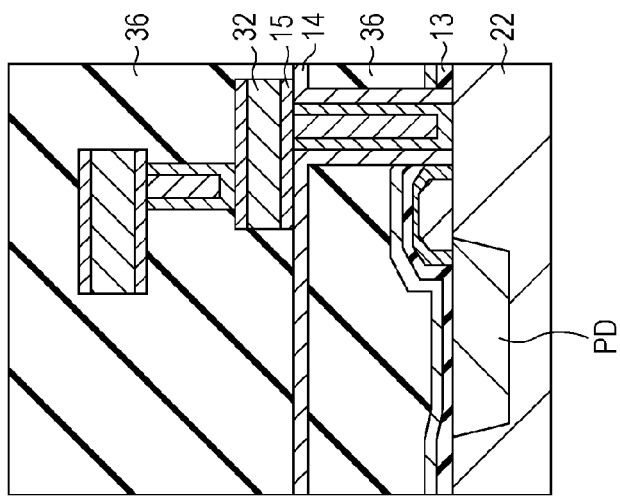
FIG. 10A is a schematic diagram (1) for describing a modified example of the third embodiment.

Furthermore, in the third embodiment, a case is described as an example where the metal oxide film 14 is formed immediately under the wiring 32 of the first layer, it is sufficient that the metal oxide film 14 is formed between the oxide film 13 and the adhesion layer 15, and it is not necessary that the metal oxide film 14 is necessarily immediately under the wiring 32 of the first layer. For example, as shown in FIG. 10A, the metal oxide film 14 may be formed on the upper layer of a working stopper film of the transistor.

Figure 10B:
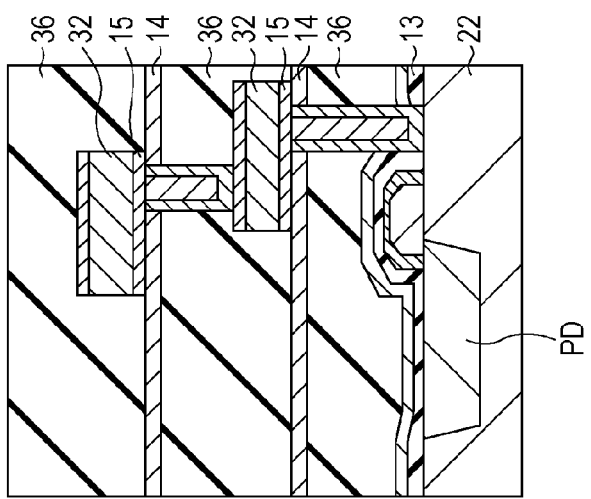
FIG. 10B is a schematic diagram (2) for describing a modified example of the third embodiment.

Furthermore, in the third embodiment, a case is described as an example where the metal oxide film 14 is formed only immediately under the wiring 32 of the first layer, but at least the metal oxide film 14 may be formed immediately under the wiring 32 of the first layer. For that reason, as shown in FIG. 10B, the metal oxide film 14 may be formed immediately under the wirings 32 of each layer. In addition, in a case where the metal oxide film 14 is formed immediately under the wirings 32 of each layer, it is possible to further satisfactorily suppress the generation of the dark current.

Figure 10C:
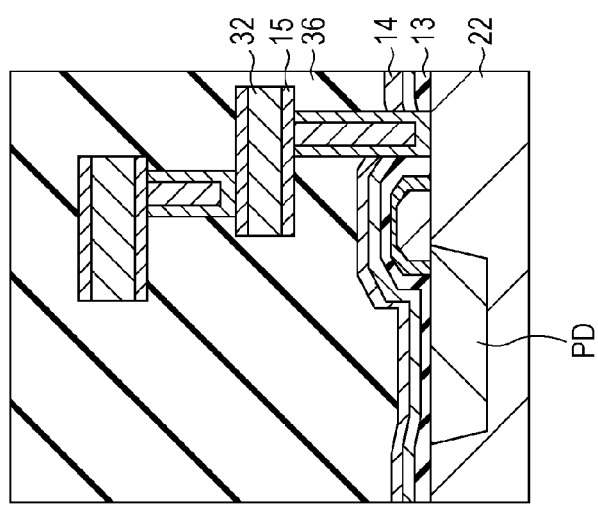
FIG. 10C is a schematic diagram (3) for describing a modified example of the third embodiment.

Furthermore, in the third embodiment, a case is described as an example where the metal oxide film 13 is not formed in a via region, but, for example, as shown in FIG. 10C, the metal oxide film 14 may be formed even in the side of the via. In addition, in a case where the metal oxide film 14 is formed in the side wall of the via, it is possible to further satisfactorily suppress the generation of the dark current.

Example of Manufacturing Method of Solid-State Imaging Apparatus

FIGS. 11A to 11C, 12A, and 12B show a manufacturing method of the solid-state imaging apparatus 85 of the third embodiment.

In the manufacturing method of the solid-state imaging apparatus 85 of the third embodiment, firstly in a region where a pixel region of the semiconductor substrate 22 of silicon should be formed, the photodiode PD is formed which corresponds to each pixel separated by the element separation region by the p type semiconductor region. In addition, the oxide film 13 is formed on the surface of the substrate by the CVD method.

Figure 11A:
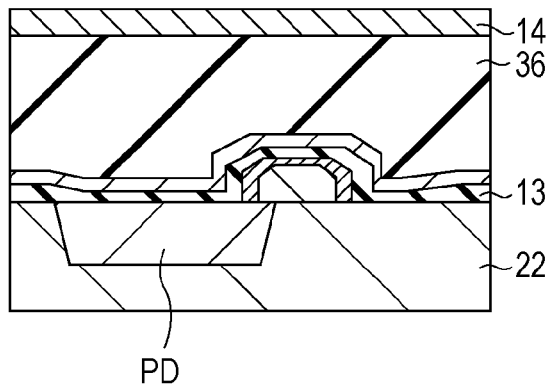
FIGS. 11A to 11C are schematic diagrams (1) for describing a manufacturing method of the solid-state imaging apparatus of the third embodiment.
Figure 11B:
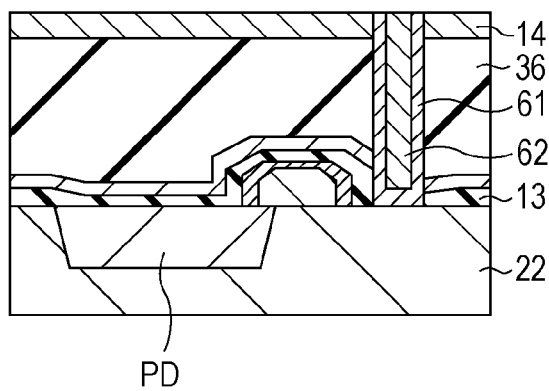

Next, as shown in FIG. 11A, on the substrate surface becoming the light reception surface, the inter-layer insulation film 36 is formed, and $Ta_2O_5$ is formed as the metal oxide film 14.

In addition, herein, the metal oxide film 14 is deposited by a reactive sputtering method using a mixed gas of oxygen gas and argon gas, the film formation temperature thereof is from room temperature to 400° C., and the film thickness is about 1 nm to 100 nm.

Furthermore, a contact hole for a contact plug is formed using a general-purpose lithography technique and etching technique. Next, a metal nitride film is buried and formed as a contact barrier metal 61 by the PVD method, and tungsten is buried and formed as a contact plug metal 62 by the CVD method (see FIG. 11B).

Figure 11C:
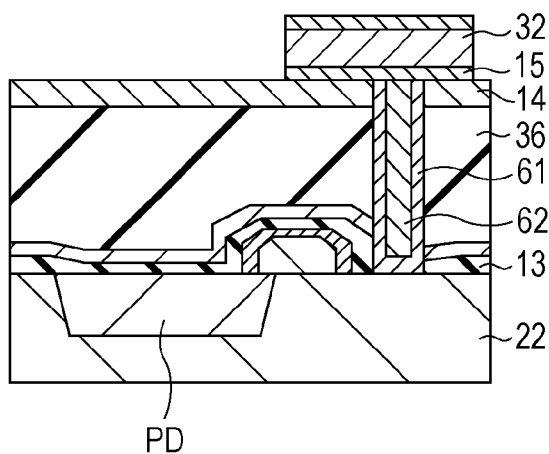

Next, titanium/titanium nitride/aluminum alloy (Al-0.5% Cu)/titanium nitride is stacked by the PVD method, the wiring patterning is performed by the use of a lithography technique and a metal dry etching processing technique, and the metal wiring layer is formed (see FIG. 11C).

Figure 12A:
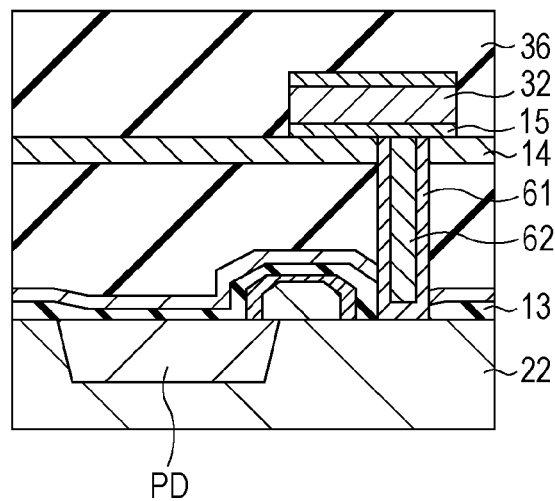
FIGS. 12A and 12B are schematic diagrams (2) for describing a manufacturing method of the solid-state imaging apparatus of the third embodiment.
Figure 12B:
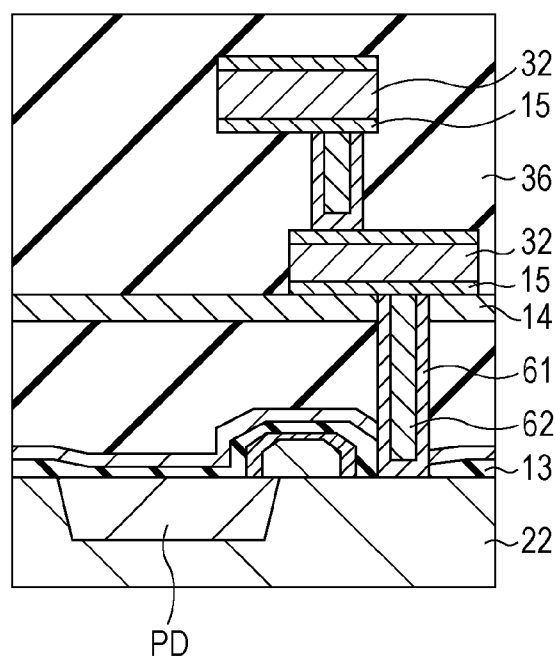

Furthermore, the oxide film is formed by the CVD method, and the inter-layer film 36 is formed via the planarization processing by the CMP (see FIG. 12A). Next, the contact formation and the formation of the wiring 32 and inter-layer insulation film 36 are repeated to form a multi-layer wiring structure (see FIG. 12B).

Next, the planarization film 41 is formed on the upper layer of the multi-layer wiring layer. The planarization film 41 is formed, for example, by applying an organic material such as resin.

After that, for example, the on-chip color lens 42 and the on-chip micro lens 43 of the Bayer arrangement are sequentially formed on the planarization film 41. In this manner, the solid-state imaging apparatus 85 of the third embodiment as shown in FIG. 9 can be obtained.

5. FOURTH EMBODIMENT

Configuration Example of Solid-State Imaging Apparatus

Figure 13:
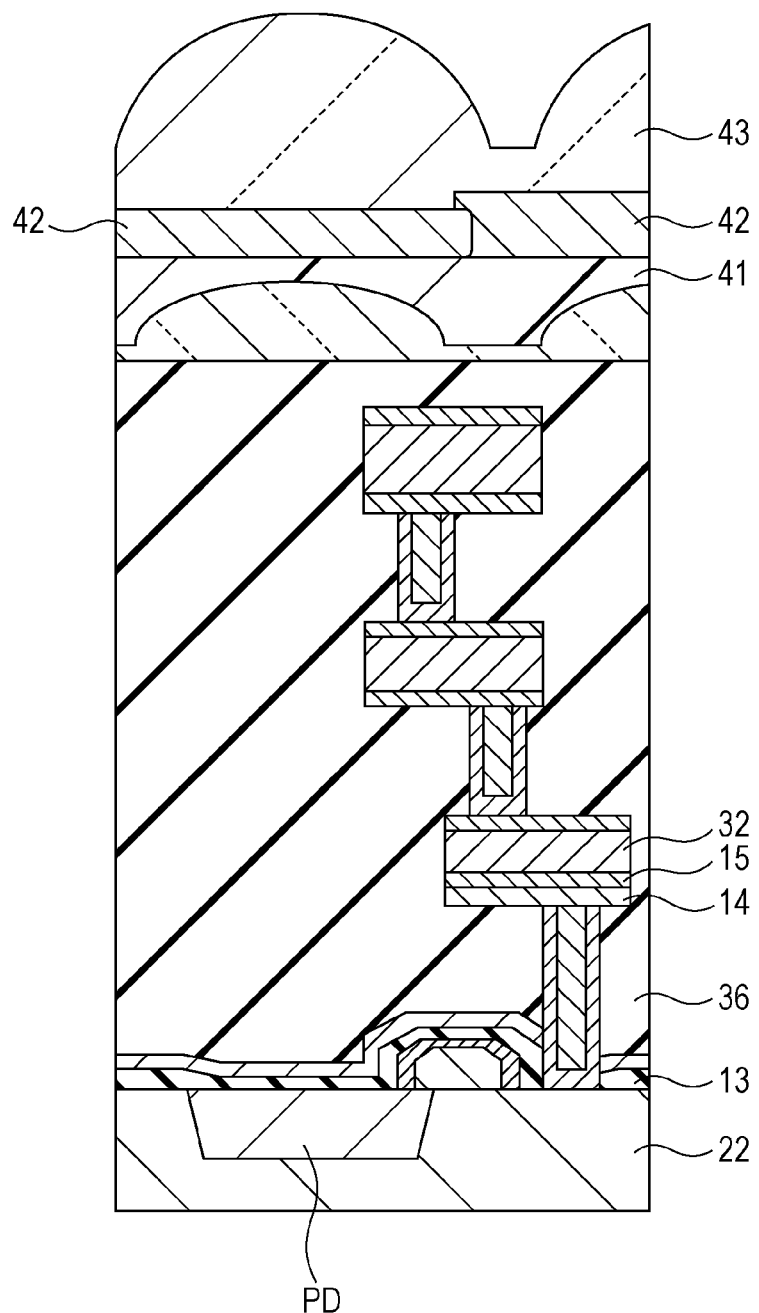
FIG. 13 is a schematic diagram for describing a fourth embodiment of a solid-state imaging apparatus according to an embodiment of the present disclosure.

FIG. 13 is a schematic diagram for describing a fourth embodiment of the solid-state imaging apparatus according to an embodiment of the present disclosure. The solid-state imaging apparatus of the present embodiment is a CMOS type solid-state imaging apparatus of a surface irradiation type. A solid-state imaging apparatus 85 according to the fourth embodiment is configured by forming a pixel region (a so-called imaging region), where a plurality of pixels is arranged on a semiconductor substrate 22, for example, formed of silicon, and a peripheral circuit portion disposed around the pixel region.

A unit pixel includes a photodiode PD becoming a photoelectric conversion portion, and a plurality of pixel transistors Tr. The photodiode PD is configured as a pn bonding type photodiode by an n type semiconductor region (not shown) and a p type semiconductor region (not shown). In addition, the p type semiconductor region facing the front and back of the substrate also functions as a positive hole electric charge accumulation region for suppressing the dark current.

Each pixel including the photodiode PD and the pixel transistor Tr is separated by an element separation region (not shown) formed in the p type semiconductor region. The pixel transistor Tr forms an n type source region and a drain region in a p type semiconductor well region formed on a surface side of the semiconductor substrate 22, and forms a gate electrode on the substrate surface between both regions via a gate insulation film.

On the surface becoming the light reception surface of the semiconductor substrate 22, an oxide film 13 is formed, and an inter-layer insulation film 36 is formed on the oxide film 13. Furthermore, on the upper layer of the inter-layer insulation film 36, the wiring 32 is formed via the metal oxide film 14 formed of $Ta_2O_5$ and the adhesion layer 15 formed of Ti. In addition, a plurality of wirings 32 is disposed via the inter-layer insulation film 36, and a so-called multilayer wiring layer is formed. In addition, in the fourth embodiment, the metal oxide film 14 is formed only in the forming region of the wiring 32.

Furthermore, a planarization film 41 is formed on the upper layer of the multilayer wiring layer, and an on-chip color filter 42 and an on-chip micro lens 43 are sequentially formed on the planarization film 41. In addition, the planarization film 41 can be formed of, for example, an organic material such as resin, and, as the on-chip color filter 42, for example, a color filter of a Bayer arrangement can be used. Furthermore, the on-chip micro lens 43 can be formed of, for example, an organic material such as resin.

In the surface irradiation type solid-state imaging apparatus 85 according to the fourth embodiment, the metal oxide film 14 formed of $Ta_2O_5$, which shows an oxidation enthalpy smaller than that of $SiO_2$ forming the oxide film 13, is disposed between the oxide film 13 and the adhesion layer 15. Moreover, removing oxygen atoms from the metal oxide film 14 is more stable in view of a chemical reaction and energy, as compared to removing oxygen atoms of the oxide film 13. For that reason, it is suppressed that the interface layer between the semiconductor substrate 22 and the oxide film 13 removes oxygen atoms from Ti forming the adhesion layer 15, so that the interface layer between the semiconductor substrate 22 and the oxide film 13 is protected and is not damaged, whereby it is possible to suppress the generation of dark current due to the formation of the interface state.

In addition, in the fourth embodiment, the metal oxide film 14 is formed only in the forming region of the wiring 32, and the structure of upper portion of the photodiode PD is the same as that of the common solid-state imaging apparatus (a solid-state imaging apparatus in which the metal oxide film 14 is not formed). For that reason, the transmittance or the refractive index of the material forming the metal oxide film 14 may be anything, the degree of freedom of the material selection or the film forming condition is high and restrictions on the integration are few. Thus, it is possible to build the stable manufacturing process with wider process window conditions.

MODIFIED EXAMPLE

In the fourth embodiment, a case is described as an example where a tantalum oxide ($Ta_2O_5$) layer is used as the metal oxide film 14, but it is not necessary to typically use a tantalum oxide ($Ta_2O_5$) layer. That is, it is sufficient that the metal oxide film 14 is formed of a material which shows the oxidation enthalpy smaller than that of the material (in the case of the present embodiment, $SiO_2$) forming the oxide film 13, and it is not necessary that the metal oxide film 14 is typically formed of a tantalum oxide ($Ta_2O_5$) layer. For example, the metal oxide film 14 may be formed of niobium oxide ($Nb_2O_5$), vanadium oxide ($V_2O_3$), chromium oxide ($Cr_2O_3$), tungsten oxide ($WO_2$), molybdenum oxide ($MoO_2$) or the like. In addition, if the metal oxide film 14 is formed of a material that shows the oxidation enthalpy smaller than that of the material forming the oxide film 13, it is also not necessary that the material is an oxide.

Furthermore, in the fourth embodiment, a case is described as an example where the metal oxide film 14 is formed immediately under the wiring 32 of the first layer; however, it is sufficient if the metal oxide film 14 is at least formed immediately under the wiring 32 of the first layer. For that reason, for example, the metal oxide film 14 may be formed immediately under the wirings 32 of each layer. In addition, in a case where the metal oxide film 14 is formed immediately under the wirings 32 of each layer, it is possible to further satisfactorily suppress the generation of the dark current.

Example of Manufacturing Method of Solid-State Imaging Apparatus

FIGS. 14A to 14C, 15A and 15B show a manufacturing method of the solid-state imaging apparatus 85 of the fourth embodiment.

In the manufacturing method of the solid-state imaging apparatus 85 of the fourth embodiment, firstly in a region where a pixel region of the semiconductor substrate 22 of silicon should be formed, the photodiode PD is formed which corresponds to each pixel separated by the element separation region by the p type semiconductor region. In addition, the oxide film 13 is formed on the surface of the substrate by the CVD method.

Figure 14A:
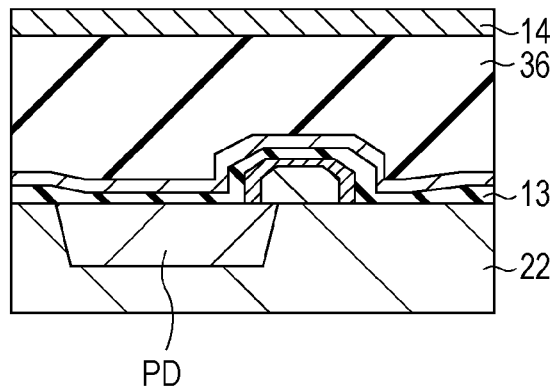
FIGS. 14A to 14C are schematic diagrams (1) for describing a manufacturing method of the solid-state imaging apparatus of the fourth embodiment.
Figure 14B:
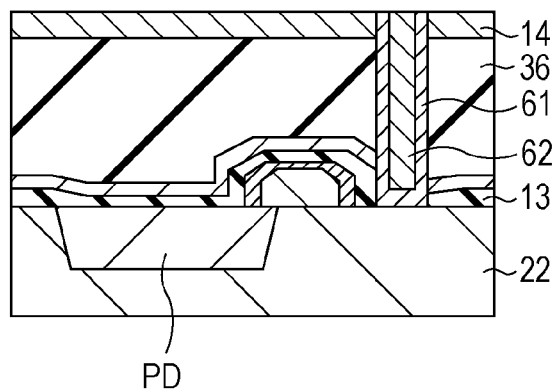
Figure 14C:
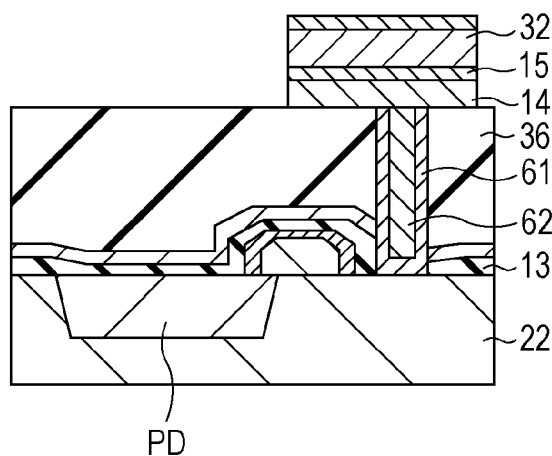

Next, as shown in FIG. 14A, on the substrate surface becoming the light reception surface, the inter-layer insulation film 36 is formed, and $Ta_2O_5$ is formed as the metal oxide film 14.

In addition, herein, the metal oxide film 14 is deposited by a reactive sputtering method using a mixed gas of oxygen gas and argon gas, the film formation temperature thereof is from room temperature to 400° C., and the film thickness is about 1 nm to 100 nm.

Furthermore, a contact hole for a contact plug is formed using a general-purpose lithography technique and etching technique. Next, a metal nitride film is buried and formed as a contact barrier metal 61 by the PVD method, and tungsten is buried and formed as a contact plug metal 62 by the CVD method (see FIG. 14B).

Next, titanium/titanium nitride/aluminum alloy (Al-0.5% Cu)/titanium nitride is stacked by the PVD method, the wiring patterning is performed by the use of the lithography technique and the metal dry etching processing technique, and the metal wiring layer is formed. In addition, in the present embodiment, by performing an over etching when the metal wiring layer is subjected to the dry etching processing, the metal oxide film 14 other than the forming region of the wiring 32 is etched and removed (see FIG. 14C).

Figure 15A:
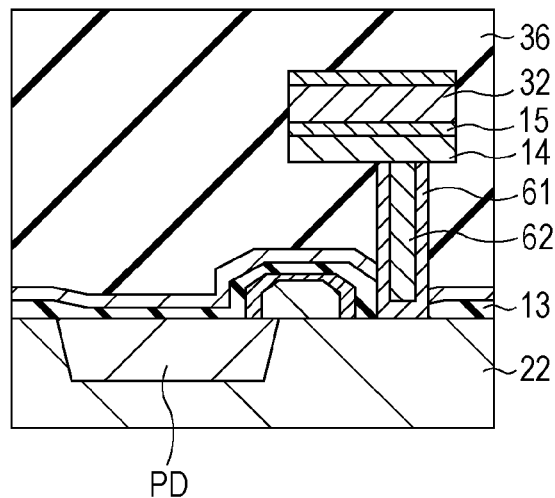
FIGS. 15A and 15B are schematic diagrams (2) for describing a manufacturing method of the solid-state imaging apparatus of the fourth embodiment.
Figure 15B:
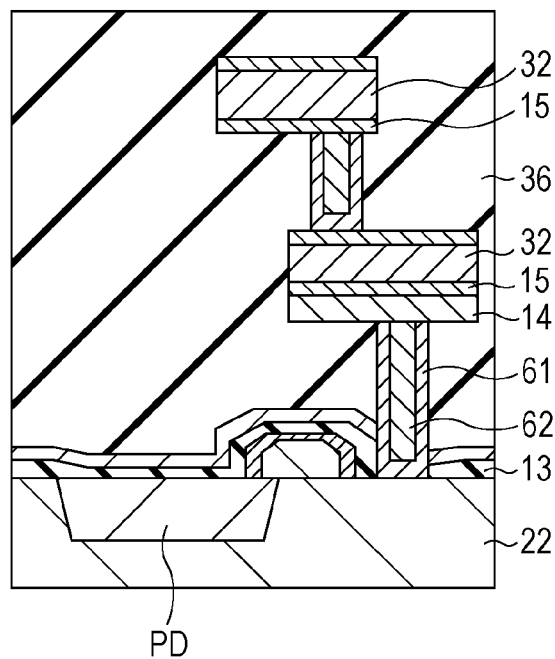

Furthermore, the oxide film is formed by the CVD method, and the inter-layer film 36 is formed via the planarization processing by the CMP (see FIG. 15A). Next, the contact formation and the formation of the wiring 32 and inter-layer insulation film 36 are repeated to form a multi-layer wiring structure (see FIG. 15B).

Next, the planarization film 41 is formed on the upper layer of the multi-layer wiring layer. The planarization film 41 is formed, for example, by applying an organic material such as resin.

After that, for example, the on-chip color lens 42 and the on-chip micro lens 43 of the Bayer arrangement are sequentially formed on the planarization film 41. In this manner, the solid-state imaging apparatus 85 of the fourth embodiment as shown in FIG. 13 can be obtained.

6. FIFTH EMBODIMENT

Configuration of Camera

Figure 16:
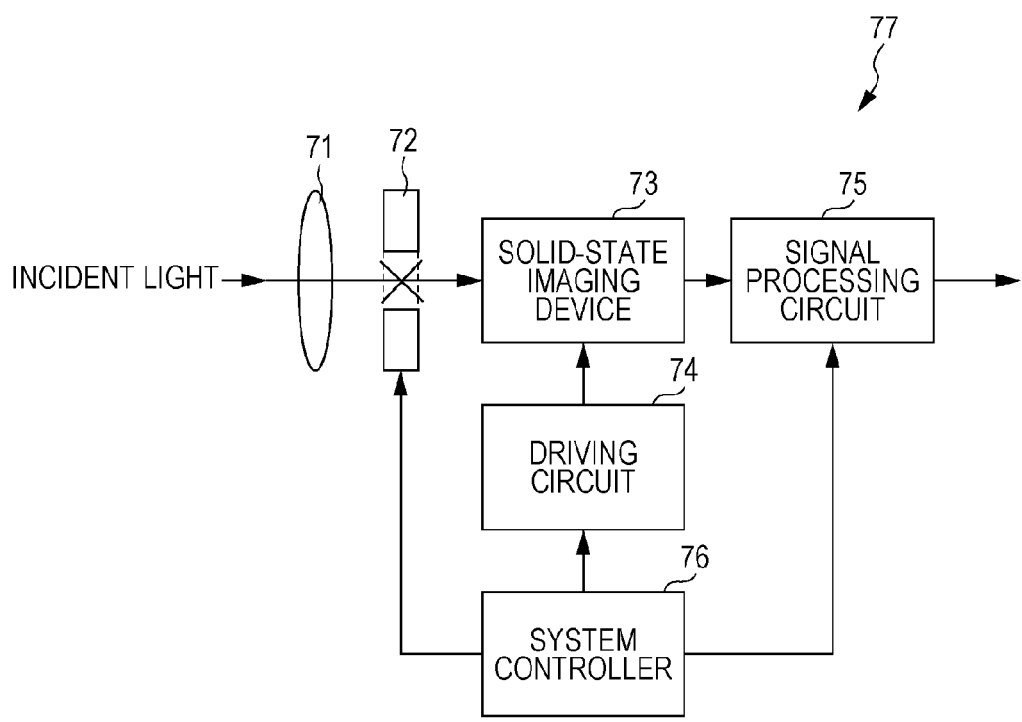
FIG. 16 is a schematic diagram for describing a camera that is an example of an imaging apparatus to which an embodiment of the present disclosure is applied.

FIG. 16 is a schematic diagram for describing a camera 77 that is an example of an imaging device to which an embodiment of the present disclosure is applied. Moreover, the camera 77 shown in FIG. 16 is one in which the solid-state imaging apparatus of the first to fourth embodiments is used as an imaging device.

In the camera 77 to which an embodiment of the present disclosure is applied, light from a subject (not shown) is incident to an imaging area of the solid-state imaging apparatus 73 via an optical system such as a lens 71 and a mechanical shutter 72. In addition, the mechanical shutter 72 shuts off the incidence of light to the imaging area of the solid-state imaging apparatus 73 to determine a light exposure period.

Herein, the solid-state imaging apparatus 73 uses the solid-state imaging apparatus 1 according to the first to fourth embodiments mentioned above and is driven by the driving circuit 74 including a timing generating circuit, a driving system or the like.

Furthermore, the output signal of the solid-state imaging apparatus 73 is subjected to various single processes by the signal processing circuit 75 of the next stage and then is derived to the outside as the imaging signal. The derived imaging signal is stored in a storage medium such as memory or is output to a monitor.

In addition, the open and close control of the mechanical shutter 72, the control of the driving circuit 74, the control of the signal processing circuit 75 or the like is performed by the system controller 76.

In the camera to which an embodiment of the present disclosure is applied, since the solid-state imaging apparatus is adopted, the generation of dark current can be suppressed, whereby the captured image of high picture quality can be obtained.

7. MODIFIED EXAMPLE

Color Filter

In the first to fifth embodiments described above, although a case is described as an example where the color filter 42 of an RGB Bayer arrangement is used, in order to improve color reproducibility and realize a highly accurate solid-state imaging apparatus, an organic photoelectric conversion film may be used.

Figure 17:
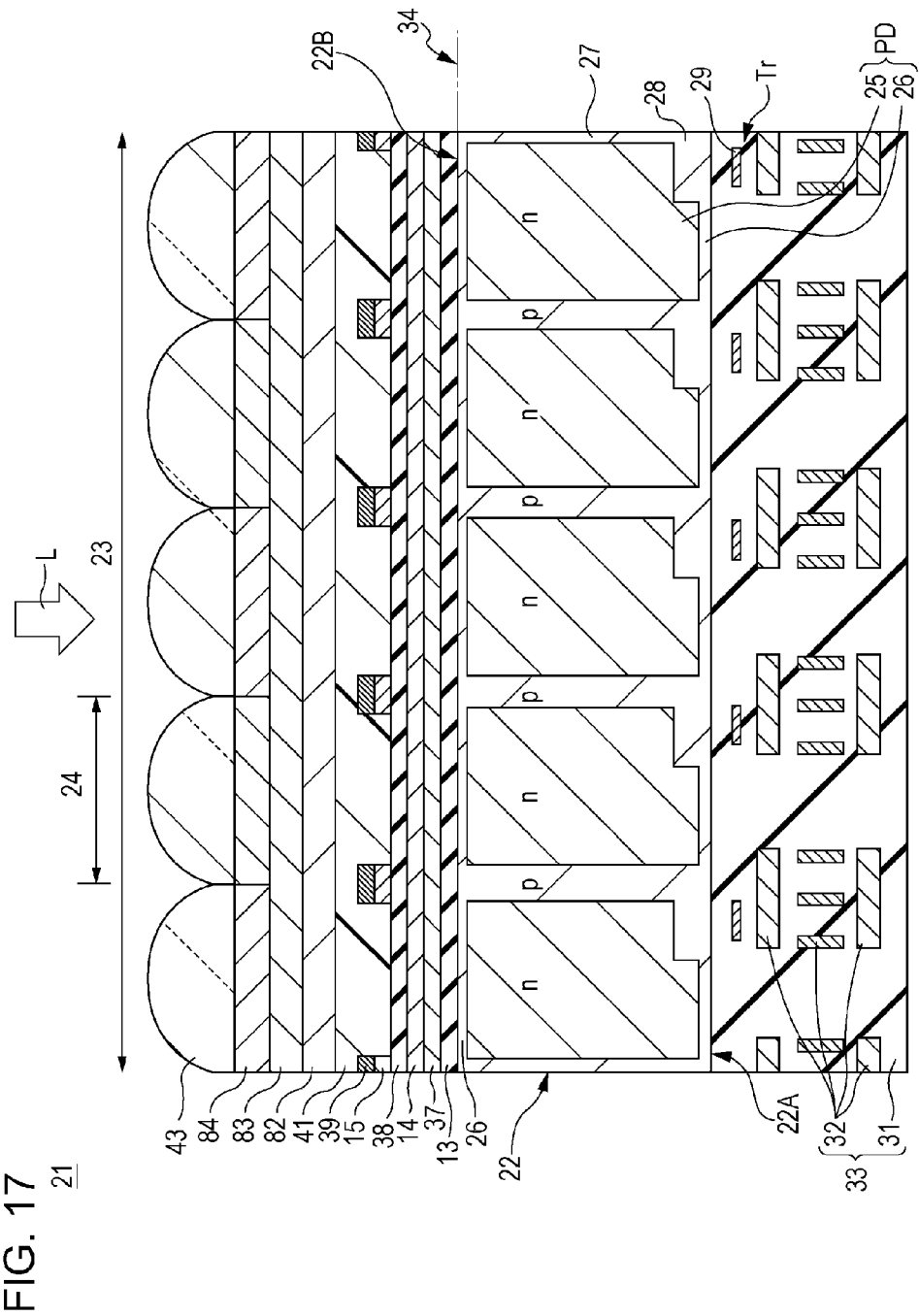
FIG. 17 is a schematic diagram for describing a modified example of the first embodiment.

FIG. 17 is a schematic diagram for describing a modified example of the first embodiment. In the solid-state imaging apparatus 21 shown in FIG. 17, an organic photoelectric conversion film 82 is formed on the upper layer of the planarization film 41 and an organic color filter layer 84 is formed via the separation layer 83.

The organic color filter layer 84 is formed corresponding to the photodiode PD, and is, for example, formed by disposing an organic color filter layer 84C of cyan and an organic color filter layer 84Y of yellow in a check pattern so as to take out blue (B) and red (R). Furthermore, on the organic color filter layer 84, an on-chip micro lens 43 is formed which focuses the incident light on each photodiode PD.

A green (G) based-pigment of the organic photoelectric conversion film 82 includes, as an example, rhodamine series pigment, phthalocyanine derivative, quinacridone, eosine-Y, merocyanine series pigment or the like.

The solid-state imaging apparatus 21 of the present embodiment takes out a signal of green (G) from the organic photoelectric conversion film 82, and takes out blue (B) and red (R) from the combination of cyan and yellow with the organic color filter layer 84.

Hereinafter, an example of a planar arrangement (coding) of the organic photoelectric conversion film 82 and the organic color filter layer 84 will be described based on FIGS. 18A and 18B.

Figure 18A:
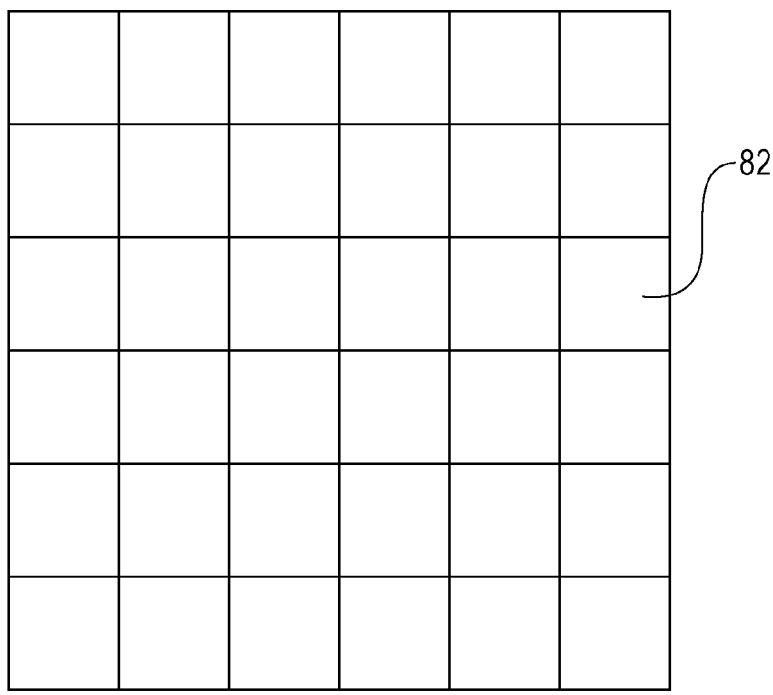
FIGS. 18A and 18B are schematic diagrams for describing an example of a planar arrangement (coding) of an organic photoelectric conversion film and an organic color filter layer.
Figure 18B:
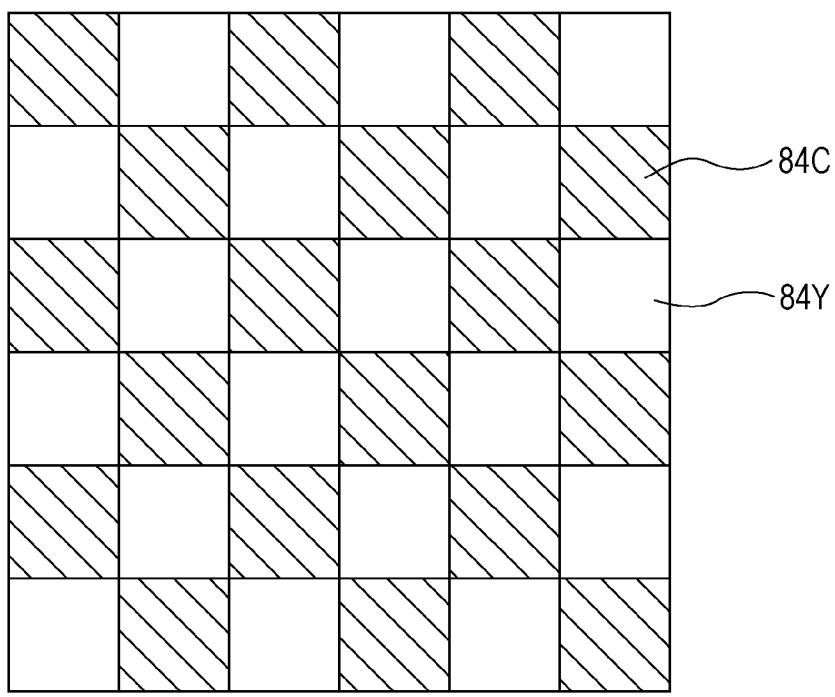

As shown in FIG. 18A, green (G) formed of the organic photoelectric conversion film 82 is disposed in all the pixels. Furthermore, as shown in FIG. 18B, cyan and yellow are in a so-called check pattern arrangement. The spectrum of blue (B) and red (R) is achieved by the principle as below.

That is, red (R) component is removed by the absorption of cyan in the organic color filter layer 84C, and green (G) component is removed by the continued absorption of green (G) by the organic photoelectric conversion film 82, whereby blue (B) can be taken out from the remaining blue (B) component.

Meanwhile, the blue (B) component is removed by the absorption of yellow in the organic color filter layer 84Y and the green (G) component is removed by the continued absorption of green (G) by the organic photoelectric conversion film 82, whereby red (R) can be taken out from the remaining red (R) component.

The separated color signals of green (G), blue (B) and red (R) can be output by the configuration described above.

In addition, the organic color filter layer 84C of cyan and the organic color filter layer 84Y of yellow are arranged so as to become a so-called check pattern arrangement, whereby the spatial luminance or resolution of chroma is slightly dropped. However, it is possible to considerably improve color reproducibility.

Semiconductor Substrate

In the first to fifth embodiments described above, a case is described as an example where the semiconductor substrate is formed of silicon, but it is not necessary that the semiconductor substrate is necessarily the silicon substrate, and the semiconductor substrate may be formed by other semiconductor materials.

The present disclosure contains subject matter related to that disclosed in Japanese Priority Patent Application JP 2010-194181 filed in the Japan Patent Office on Aug. 31, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging element comprising:
a semiconductor substrate that has a light reception portion that performs a photoelectric conversion of an incident light;
an oxide layer formed on a surface of the semiconductor substrate;
a light shielding layer over the oxide layer;
an adhesion layer between the oxide layer and the light shielding layer; and
an oxygen supply layer between the oxide layer and the adhesion layer and formed of a material which shows an oxidation enthalpy smaller than that of a material forming the oxide layer.

2. The solid-state imaging element according to claim 1, wherein the oxygen supply layer is formed of a light transmissive material and is formed over approximately an entire surface of a region corresponding to a region where the light reception portion of the semiconductor substrate is formed.

3. The solid-state imaging element according to claim 1, wherein the oxygen supply layer is formed only in a region corresponding to a region where the light shielding layer is formed.

4. The solid-state imaging element according to claim 1, wherein an oxidation enthalpy of a material forming the adhesion layer and the light shielding layer is greater than that of the material forming the oxide layer.

5. The solid-state imaging element according to claim 1, wherein the adhesion layer and the light shielding layer each contain at least one material of aluminum, titanium, aluminum alloy and titanium nitride.

6. The solid-state imaging element according to claim 1, wherein the oxygen supply layer is configured by the use of tantalum oxide ($Ta_2O_5$), niobium oxide ($Nb_2O_5$), vanadium oxide ($V_2O_3$), chromium oxide ($Cr_2O_3$), tungsten oxide ($WO_2$) or molybdenum oxide ($MoO_2$).

7. The solid-state imaging element according to claim 1, wherein the solid-state imaging element is a back irradiation type solid-state imaging element which includes a plurality of pixel portions each having a light reception portion converting incident light into an electric signal, and a wiring layer in a surface side of the semiconductor substrate formed with the pixel portions, and receives light, which is incident from a side opposite to the surface formed with the wiring layer, by the light reception portion.

8. A solid-state imaging element comprising:
a semiconductor substrate that has a light reception portion that performs a photoelectric conversion of an incident light;
an oxide layer that is formed on a surface of the semiconductor substrate;
a wiring layer formed over the oxide layer;
an adhesion layer between the wiring layer and the oxide layer; and
an oxygen supply layer between the oxide layer and the adhesion layer and formed of a material which shows an oxidation enthalpy smaller than that of a material forming the oxide layer.

9. The solid-state imaging element according to claim 8, wherein the oxygen supply layer is formed of a light transmissive material and is formed over an approximately entire surface of a region corresponding to a region where the light reception portion of the semiconductor substrate is formed.

10. The solid-state imaging element according to claim 8, wherein the oxygen supply layer is formed only in a region corresponding to a region where the wiring layer is formed.

11. The solid-state imaging element according to claim 8, wherein an oxidation enthalpy of a material forming the adhesion layer and the light shielding layer is greater than that of the material forming the oxide layer.

12. The solid-state imaging element according to claim 8, wherein the adhesion layer and the light shielding layer each contain at least one material of aluminum, titanium, aluminum alloy and titanium nitride.

13. The solid-state imaging element according to claim 8, wherein the oxygen supply layer is configured by the use of tantalum oxide ($Ta_2O_5$), niobium oxide ($Nb_2O_5$), vanadium oxide ($V_2O_3$), chromium oxide ($Cr_2O_3$), tungsten oxide ($WO_2$) or molybdenum oxide ($MoO_2$).

14. A method of manufacturing a solid-state imaging element comprising:
   forming an oxygen supply layer formed of a material, which shows an oxidation enthalpy smaller than that of a material forming an oxide layer, on an upper layer of a semiconductor substrate that has a light reception portion for performing a photoelectric conversion of an incident light and is formed with the oxide layer on a surface thereof; and
   forming a light shielding layer on an upper layer further than the oxygen supply layer with an adhesion layer between the light shielding layer and the oxide layer.

15. A method of manufacturing a solid-state imaging element comprising:
   forming an oxygen supply layer formed of a material, which shows an oxidation enthalpy smaller than that of a material forming an oxide layer, on an upper layer of a semiconductor substrate that has a light reception portion for performing a photoelectric conversion of an incident light and is formed with the oxide layer on a surface thereof; and
   forming a wiring layer on an upper layer further than the oxygen supply layer with an adhesion layer between the wiring layer and the oxide layer.

16. A solid-state imaging apparatus comprising:
   a solid-state imaging element which has a semiconductor substrate that includes a light reception portion that performs a photoelectric conversion of an incident light, an oxide layer formed on a surface of the semiconductor substrate, a light shielding layer formed over the oxide layer, an adhesion layer between the light shielding layer and the oxide layer, and an oxygen supply layer disposed between the oxide layer and the adhesion layer and formed of a material which shows an oxidation enthalpy smaller than that of a material forming the oxide layer; and
   an optical system that focuses the incident light on the light reception portion.

17. A solid-state imaging apparatus comprising:
   a solid-state imaging element which has a semiconductor substrate that includes a light reception portion that performs a photoelectric conversion of an incident light, an oxide layer formed on a surface of the semiconductor substrate, a wiring layer formed over the oxide layer, an adhesion layer between the wiring layer and the oxide layer, and an oxygen supply layer disposed between the oxide layer and the adhesion layer and formed of a material which shows an oxidation enthalpy smaller than that of a material forming the oxide layer; and
   an optical system that focuses the incident light on the light reception portion.

18. An imaging apparatus comprising:
   a solid-state imaging element which has a semiconductor substrate that includes a light reception portion that performs a photoelectric conversion of an incident light, an oxide layer formed on a surface of the semiconductor substrate, a light shielding layer formed over the oxide layer, an adhesion layer between the light shielding layer and the oxide layer, and an oxygen supply layer disposed between the oxide layer and the adhesion layer and formed of a material which shows an oxidation enthalpy smaller than that of a material forming the oxide layer;
   an optical system that focuses the incident light on the light reception portion; and
   a signal processing portion that processes a signal electric charge subjected to the photoelectric conversion in the light reception portion.

19. An imaging apparatus comprising:
   a solid-state imaging element which has a semiconductor substrate that includes a light reception portion that performs a photoelectric conversion of an incident light, an oxide layer formed on a surface of the semiconductor substrate, a wiring layer formed over the oxide layer, an adhesion layer between the wiring layer and the oxide layer, and an oxygen supply layer disposed between the oxide layer and the adhesion layer and formed of a material which shows an oxidation enthalpy smaller than that of a material forming the oxide layer;
   an optical system that focuses the incident light on the light reception portion; and
   a signal processing portion that processes a signal electric charge subjected to the photoelectric conversion in the light reception portion.

* * * * *